United States Patent
We et al.

(10) Patent No.: US 9,633,977 B1
(45) Date of Patent: Apr. 25, 2017

(54) INTEGRATED DEVICE COMPRISING FLEXIBLE CONNECTOR BETWEEN INTEGRATED CIRCUIT (IC) PACKAGES

(71) Applicant: QUALCOMM Incorporated, San Diego, CA (US)

(72) Inventors: Hong Bok We, San Diego, CA (US); Shiqun Gu, San Diego, CA (US); Urmi Ray, San Diego, CA (US); Ratibor Radojcic, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/040,902

(22) Filed: Feb. 10, 2016

(51) Int. Cl.
| | |
|---|---|
| H01L 25/065 | (2006.01) |
| H05K 1/14 | (2006.01) |
| H01L 23/538 | (2006.01) |
| H01L 23/498 | (2006.01) |
| H01L 25/16 | (2006.01) |
| H01L 25/00 | (2006.01) |
| H01L 21/48 | (2006.01) |

(52) U.S. Cl.
CPC ...... *H01L 25/0655* (2013.01); *H01L 21/4857* (2013.01); *H01L 23/49894* (2013.01); *H01L 23/5383* (2013.01); *H01L 23/5385* (2013.01); *H01L 23/5386* (2013.01); *H01L 23/5387* (2013.01); *H01L 23/5389* (2013.01); *H01L 25/16* (2013.01); *H01L 25/50* (2013.01); *H05K 1/14* (2013.01)

(58) Field of Classification Search
CPC ............... H01L 23/5387; H01L 21/565; H01L 23/49833; H01L 21/4853
See application file for complete search history.

(56) References Cited

U.S. PATENT DOCUMENTS

| | | | |
|---|---|---|---|
| 6,448,508 B1 | 9/2002 | Lequenne | |
| 6,531,662 B1 | 3/2003 | Nakamura | |
| 6,940,729 B2* | 9/2005 | Cady | .................... H01L 23/3114 |
| | | | 174/254 |
| 7,061,122 B2 | 6/2006 | Kim et al. | |
| 7,606,041 B2 | 10/2009 | Park | |
| 7,902,676 B2* | 3/2011 | Chia | .................... H01L 23/5387 |
| | | | 257/686 |

(Continued)

*Primary Examiner* — Roy Potter
*Assistant Examiner* — Paul Patton
(74) *Attorney, Agent, or Firm* — Loza & Loza, LLP

(57) ABSTRACT

Some features pertain to an integrated device that include a first integrated circuit (IC) package comprising a first laminated substrate, a flexible connector coupled to the first laminated substrate, and a second integrated circuit (IC) package comprising a second laminated substrate. The second laminated substrate is coupled to the flexible connector. The flexible connector includes a dielectric layer and an interconnect. The dielectric layer and the interconnect substantially extend into the first laminated substrate and the second laminated substrate. In some implementations, the dielectric layer and the interconnect of the flexible connector, contiguously extend into the first laminated substrate and the second laminated substrate. In some implementations, the dielectric layer extends into a substantial portion of the first laminated substrate. In some implementations, the dielectric layer includes polyimide (PI) layer.

31 Claims, 16 Drawing Sheets

(56) References Cited

U.S. PATENT DOCUMENTS

| | | | |
|---|---|---|---|
| 8,031,475 B2 * | 10/2011 | Chow | H01L 25/03 |
| | | | 174/254 |
| 8,107,776 B2 | 1/2012 | Wang et al. | |
| 8,680,688 B2 | 3/2014 | Kang et al. | |
| 2006/0033217 A1 * | 2/2006 | Taggart | H01L 23/5387 |
| | | | 257/778 |
| 2014/0291006 A1 | 10/2014 | Yamamoto et al. | |
| 2015/0003108 A1 | 1/2015 | Park et al. | |

* cited by examiner

INTEGRATED DEVICE COMPRISING FLEXIBLE CONNECTOR BETWEEN INTEGRATED CIRCUIT (IC) PACKAGES

BACKGROUND

Field of the Disclosure

Various features may relate to an integrated device, and more specifically to an integrated device that includes a flexible connector between integrated circuit (IC) packages.

Background

Mobile devices, such as smart phones, tablets, Internet of Things (IoT), etc., require a multitude of components, chipsets, and the like. Typically, these components are provided on a printed circuit board with one or more integrated circuits. Packaging these components together into a product is becoming increasingly challenging, especially in devices that have odd shapes or curved shapes. To accommodate these odd shapes or curved shapes, flexible connectors are used to couple several printed circuit boards that include chips (e.g., dies), together.

FIG. 1 illustrates an integrated device 100 that includes a first integrated circuit (IC) package 102, a second integrated circuit (IC) package 104, and a flexible connector 106. The first integrated circuit (IC) package 102 includes a printed circuit board (PCB) 120 and a first chip 122 (e.g., die, die package). The second integrated circuit (IC) package 104 includes a printed circuit board (PCB) 140 and a second chip 142 (e.g., die, die package).

The first integrated circuit (IC) package 102 is coupled to the second integrated circuit (IC) package 104 through the flexible connector 106. The flexible connector 106 is a printed circuit board (PCB) connector. The flexible connector 106 includes a plurality of wires 160, a first PCB interface 162, a second PCB interface 164, and a cover 166. The cover 166 surrounds the plurality of wires 160. The plurality of wires 160 is coupled to the first PCB interface 162 and the second PCB interface 164. The first PCB interface 162 is coupled to a surface of the first PCB 120. The second PCB interface 164 is coupled to a surface of the second PCB 140.

As illustrated in FIG. 1, the integrated device 100 is comprised of three distinct components, the first integrated circuit (IC) package 102, the second integrated circuit (IC) package 104 and the flexible connector 106. These distinct components are fabricated separately and then assembled to form the integrated device 100. The process of fabricating distinct components and then assembling them is an expensive process and creates a package that can be too large to put in small devices. It is desirable to reduce the size, height and/or spaces of packages, so that these packages are placed in smaller devices. Ideally, such a package will have a better form factor, be cheaper to fabricate, while at the same time meeting the needs and/or requirements of mobile devices, Internet of things (IoT) devices, and/or wearable devices.

SUMMARY

Various features may relate to an integrated device, and more specifically to an integrated device that includes a flexible connector between integrated circuit (IC) packages.

Some features pertain to an integrated device that include a first integrated circuit (IC) package comprising a first laminated substrate, a flexible connector coupled to the first laminated substrate, and a second integrated circuit (IC) package comprising a second laminated substrate. The second laminated substrate is coupled to the flexible connector. The flexible connector includes a dielectric layer and an interconnect. The dielectric layer and the interconnect substantially extend into the first laminated substrate and the second laminated substrate.

Some features pertain to an integrated device that include a first integrated circuit (IC) package comprising a first laminated substrate, a means for electrical connecting coupled to the first laminated substrate, and a second integrated circuit (IC) package comprising a second laminated substrate. The second laminated substrate is coupled to the flexible connector. The means for electrical connecting substantially extends into the first laminated substrate and the second laminated substrate.

Some features pertain to a method for fabricating an integrated device. The method forms a first integrated circuit (IC) package includes a first laminated substrate. The method forms a flexible connector coupled to the first laminated substrate, where forming the flexible connector includes forming a dielectric layer and an interconnect. The method forming a second integrated circuit (IC) package that includes a second laminated substrate, where forming the second laminated substrate includes coupling the second laminated substrate to the flexible connector. The dielectric layer and the interconnect are formed such that the dielectric layer and the interconnect substantially extend into the first laminated substrate and the second laminated substrate.

DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

Some features pertain to an integrated device that include a first integrated circuit (IC) package comprising a first laminated substrate, a flexible connector coupled to the first laminated substrate, and a second integrated circuit (IC) package comprising a second laminated substrate. The second laminated substrate is coupled to the flexible connector. The flexible connector includes a dielectric layer and an interconnect. The dielectric layer and the interconnect substantially extend into the first laminated substrate and the second laminated substrate. In some implementations, the dielectric layer and the interconnect of the flexible connector, contiguously extend into the first laminated substrate and the second laminated substrate. In some implementations, the dielectric layer substantially extends into a substantial portion of the first laminated substrate. In some implementations, the dielectric layer includes polyimide (PI) layer.

In some implementations, an interconnect is an element or component of a device or package that allows or facilitates an electrical connection between two points, elements and/or components. In some implementations, an interconnect may include a trace, a via, a pad, a pillar, a redistribution metal layer, and/or an under bump metallization (UBM) layer. In some implementations, an interconnect is an electrically conductive material that may be configured to provide an electrical path for a signal (e.g., data signal, ground signal, power signal). An interconnect may be part of a circuit. An interconnect may include more than one element or component.

Exemplary Integrated Device Comprising a Flexible Connector Between Packages

Figure 2:
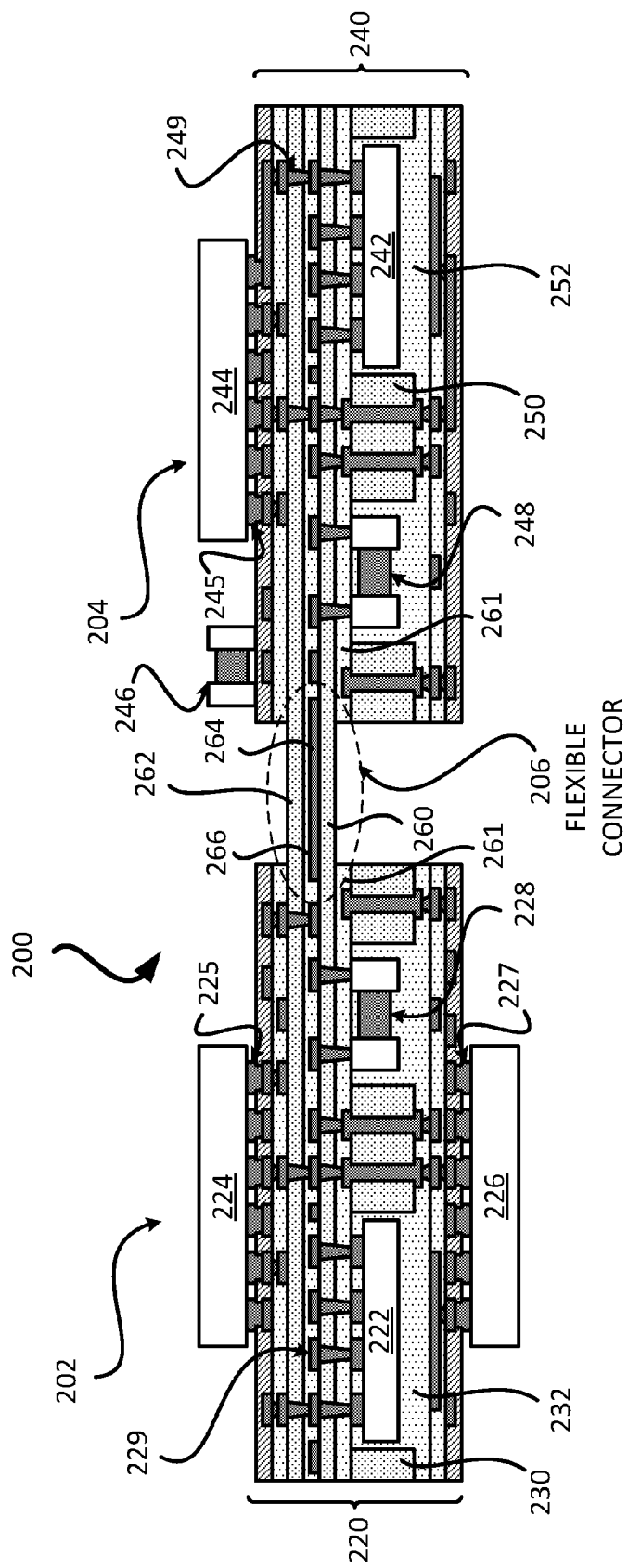
FIG. 2 illustrates a profile view of a device that includes two packages coupled together through a flexible connector.

FIG. 2 illustrates an integrated device 200 (e.g., integrated circuit (IC) device) that includes a first package 202 (e.g., first integrated circuit (IC) package), a second package 204 (e.g., second integrated circuit (IC) package) and a flexible connector 206. The first package 202 is coupled to the second package 204 through the flexible connector 206. As will be further described below, the flexible connector 206 is integrated in a first substrate 220 of the first package 202, and a second substrate 240 of the second package 204. The flexible connector 206 may be a means for electrical connecting between two packages and/or two substrates. As will be further described below, the flexible connector 206 is substantially co-planar with interconnects and dielectric layers of the first substrate 220 of the first package 202, and the second substrate 240 of the second package 204. In some implementations, the flexible connector 206 is embedded in the first substrate 220 and the second substrate 240. In some implementations, the flexible connector 206 is embedded through a side portion of the first substrate 220 and a side portion of the second substrate 240.

The first package 202 includes a first substrate 220. a first die 222, a second die 224, a third die 226, and a first passive component 228. The first substrate 220 may include a laminated substrate and/or a printed circuit board (PCB).

The first substrate 220 includes a core layer 230 and at least one dielectric layer 232. The at least one dielectric layer 232 may include a prepeg layer. The first substrate 220 includes a plurality of first interconnects 229. The plurality of first interconnects 229 may traverse through the core layer 230 and the at least one dielectric layer 232. The plurality of first interconnects 229 may include a trace, a pad, and/or a via. The first die 222 and the first passive component 228 are embedded in the first substrate 220. The first die 222 and the first passive component 228 are located in one or more cavities of the core layer 230, and surrounded by the at least one dielectric layer 232. The first passive component 228 may include a capacitor or an inductor.

The second die 224 is coupled to a first surface (e.g., top surface) of the first substrate 220 through a plurality of solder interconnects 225 (e.g., solder balls). The third die 226 is coupled to a second surface (e.g., bottom surface) of the first substrate 220 through a plurality of solder interconnects 227 (e.g., solder balls).

The first substrate 220 also includes a first adhesive layer 261, a first dielectric layer 260, a second adhesive layer 266, an interconnect 264, and a second dielectric layer 262. The first dielectric layer 260 and the second dielectric layer 262 may include a polyimide (PI) layer. In some implementations, the first adhesive layer 261, the first dielectric layer 260, the second adhesive layer 266, the interconnect 264, and the second dielectric layer 262 are formed at least partially over or under (e.g., on) the core layer 230 of the first substrate 220.

The second package 204 includes a second substrate 240, a fourth die 242, a fifth die 244, a second passive component 248, and a third passive component 246. The second substrate 240 may include a laminated substrate and/or a printed circuit board (PCB). The second substrate 240 includes a core layer 250 and at least one dielectric layer 252. The at least one dielectric layer 252 may include a prepeg layer. The second substrate 240 includes a plurality of second interconnects 249. The plurality of second interconnects 249 may traverse through the core layer 250 and the at least one dielectric layer 252. The plurality of second interconnects 249 may include a trace, a pad, and/or a via. The fourth die 242 and the second passive component 248 are embedded in the second substrate 240. The fourth die 242 and the second passive component 248 are located in one or more cavities of the core layer 250, and surrounded by the at least one dielectric layer 252. The second passive component 248 may include a capacitor or an inductor. The fifth die 244 is coupled to a first surface (e.g., top surface) of the second substrate 240 through a plurality of solder interconnects 245 (e.g., solder balls). The third passive component 246 is coupled to a first surface of the second substrate 240. The third passive component 246 may be formed on a solder resist layer or over an interconnect of the second substrate 240.

The second substrate 240 includes the first adhesive layer 261, the first dielectric layer 260, the second adhesive layer 266, the interconnect 264, and the second dielectric layer 262. The first dielectric layer 260 and the second dielectric layer 262 may include a polyimide (PI) layer. In some implementations, the first adhesive layer 261, the first dielectric layer 260, the second adhesive layer 266, the interconnect 264, and the second dielectric layer 262 are formed at least partially over or under the core layer 250 of the second substrate 240.

As mentioned above, the flexible connector 206 (e.g., means for electrical connecting between two packages) is configured to electrically couple the first substrate 220 to the second substrate 240. Thus, the flexible connector 206 is configured to electrically couple components (e.g., first die 222) of the first package 202 and components (e.g., fourth die 242) of the second package 204. The flexible connector 206 includes the first dielectric layer 260, the second dielectric layer 262, the interconnect 264, and the second adhesive layer 266. In some implementations, the flexible connector 206 is an asymmetrical flexible connector, where the number of dielectric layer is different than the number of adhesive layer. In the example of FIG. 2, the flexible connector 206 includes two dielectric layers and one adhesive layer.

As further shown in FIG. 2, the first dielectric layer 260, the second dielectric layer 262, the interconnect 264, and/or the second adhesive layer 266 extend (e.g., substantially extend, about 25 percent or more, about 50 percent or more) into the first substrate 220 and the second substrate 240. For example, about 25 percent or more of the flexible connector 206 (e.g., first dielectric layer 260, the second dielectric layer 262, the interconnect 264, and/or the second adhesive layer 266) may be embedded in the first substrate 220 and/or the second substrate 240. In another example, about 25 percent or more of the length or width of the first substrate 220 and/or the length or width of the second substrate 240 may be shared with the flexible connector 206. Thus, in some implementations, the flexible connector 206 shares the first dielectric layer 260, the second dielectric layer 262, the interconnect 264, and the second adhesive layer 266 with the first substrate 220 and the second substrate 240.

In some implementations, one or more of the first dielectric layer 260, the second dielectric layer 262, the interconnect 264, and the second adhesive layer 266 contiguously extends through the flexible connector 206, the first substrate 220 and the second substrate 240. For example, the interconnect 264 may be formed contiguously in the flexible connector 206, the first substrate 220 and the second substrate 240. In such an instance, the interconnect 264 may be formed by one contiguous interconnect that is formed in the entire flexible connector 206, at least part of the first substrate 220 and at least part of the second substrate 240.

In another example, the first dielectric layer 260 (e.g., polyimide (PI) layer) may be formed by one contiguous dielectric layer that is formed in the entire flexible connector 206, at least part of the first substrate 220 and at least part of the second substrate 240. In some implementations, the first dielectric layer 260 may be one contiguous dielectric layer that traverses the entire (or substantially the entire) first substrate 220, the flexible connector 206 and the second substrate 240.

In some implementations, one or more of the first dielectric layer 260, the second dielectric layer 262, the interconnect 264, and the second adhesive layer 266 of the flexible connector 206 is substantially co-planar with a corresponding dielectric layer (e.g., internal dielectric layer), a corresponding interconnect (e.g., internal interconnect) or a corresponding adhesive layer (e.g., internal adhesive layer) of the first substrate 220 and/or the second substrate 240.

In some implementations, the first dielectric layer 260 of the flexible connector 206 extends (e.g., substantially extends, about 25 percent or more, about 50 percent or more) into the first substrate 220 such that at least part of the first dielectric layer 260 is over and/or under the core layer 230 of the first substrate 220. Similarly, in some implementations, the first dielectric layer 260 of the flexible connector 206 extends (e.g., substantially extends, about 25 percent or more, about 50 percent or more) into the second substrate 240 such that at least part of the first dielectric layer 260 is over and/or under the core layer 250 of the second substrate 240.

It is noted that FIG. 2 illustrates the flexible connector 206 with one layer of the interconnect 264. The interconnect 264 may include a plurality of interconnects. In some implementations, the flexible connector 206 may include several layers of the interconnect 264 formed on different metal layers. Similarly, the flexible connector 206 may include several different layers of the dielectric layers (e.g., first dielectric layer 260) and/or the adhesive layers (e.g., second adhesive layer 266).

The above features and implementations of a flexible connector provide several technical advantages over other connections between packages. These technical advantages are further described below.

One, sharing the dielectric layers (e.g., polyimide (PI) layer), interconnects, and/or adhesive layers with the first substrate 220, the flexible connector 206 and the second substrate 240 provides a more compact form factor for a connection or a coupling between the first substrate 220 and the second substrate 240. Since the first substrate 220, the flexible connector 206, and the second substrate 240 share materials, there is no need to add extra interfaces to mechanically couple the first substrate 220, the flexible connector 206 and the second substrate 240. In contrast to FIG. 1, which illustrates three (3) separate components (a first integrated circuit (IC) package 102, a second integrated circuit (IC) package 104, and a flexible connector 106) that are fabricated separately and mechanically assembled together; in some implementations, the first substrate 220, the flexible connector 206 and the second substrate 240 may be considered as one contiguous body (e.g., unibody package that includes the first substrate 220, the flexible connector 206 and the second substrate 240).

Two, sharing the dielectric layers (e.g., polyimide (PI) layer), interconnects, and/or adhesive layers with the first substrate 220, the flexible connector 206 and the second substrate 240 means that the first substrate 220, the flexible connector 206 and the second substrate 240 may be fabricated together, which lowers the overall fabrication cost of the first substrate 220, the flexible connector 206 and the second substrate 240.

Figure 1:
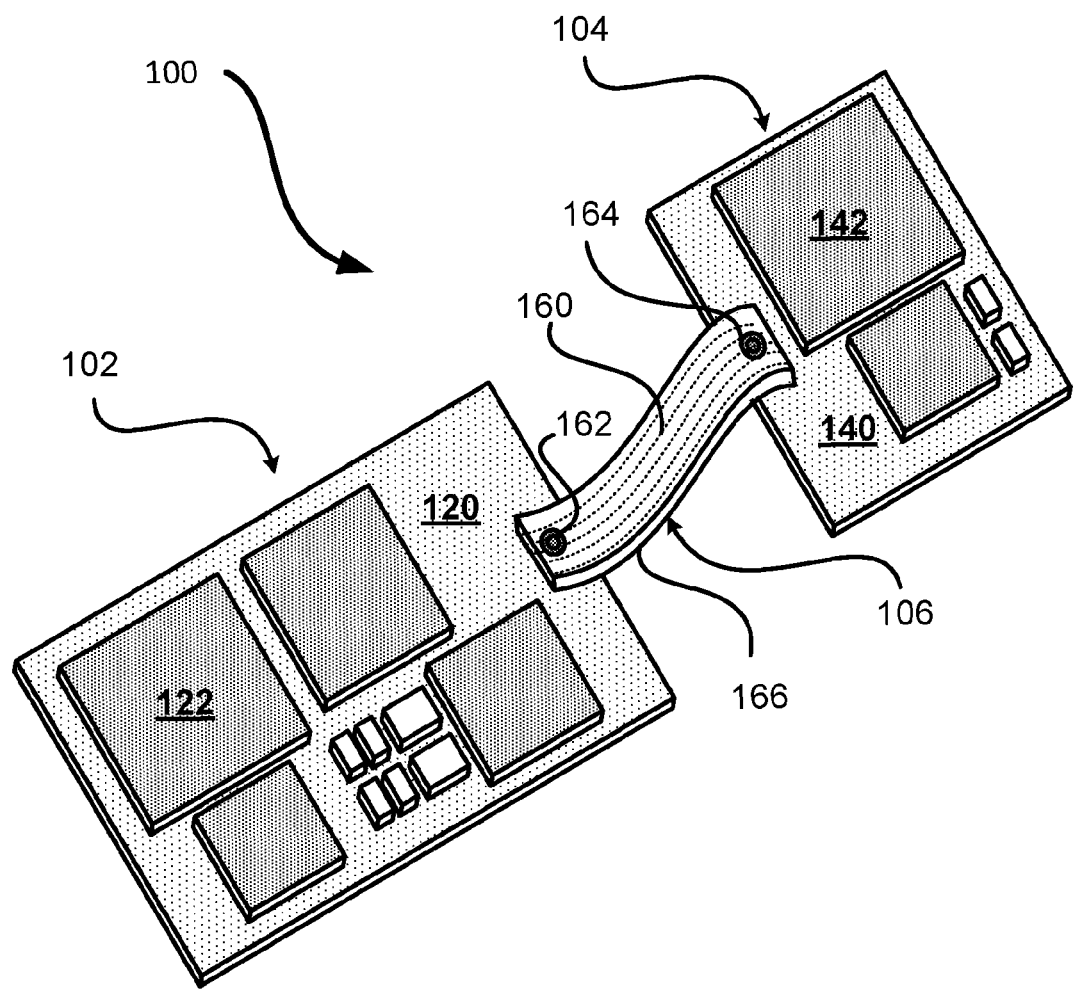
FIG. 1 illustrates a view of a device that includes two packages coupled together through a flexible connector.

Three, the implementation or embedding of the flexible connector 206 with the first substrate 220 and the second substrate 240 means a more accurate and precise connection between the first substrate 220 and the second substrate 240, since the interconnects of the flexible connector 206, the first substrate 220 and the second substrate 240 are formed during the same fabrication process. In some implementations, using the same fabrication process to fabricate the flexible connector 206, the first substrate 220 and the second substrate 240 means there is less likelihood of misalignment between connections. Generally speaking mechanical assembly of components, which is used to assemble the integrated device 100 of FIG. 1, is more prone to misalignment.

Four, the interconnects (e.g., interconnect 264) of the flexible connector 206 have finer pitch and finer spacing than other connectors and thus provide higher density connections between the first substrate 220 and the second substrate 240. In some implementations, this is possible because the interconnects (e.g., interconnect 264) of the flexible connector 206 are formed using the same fabrication process as the interconnects of the first substrate 220 and the interconnects of the second substrate 240.

Exemplary Integrated Device Comprising a Flexible Connector Between Packages

Figure 3:
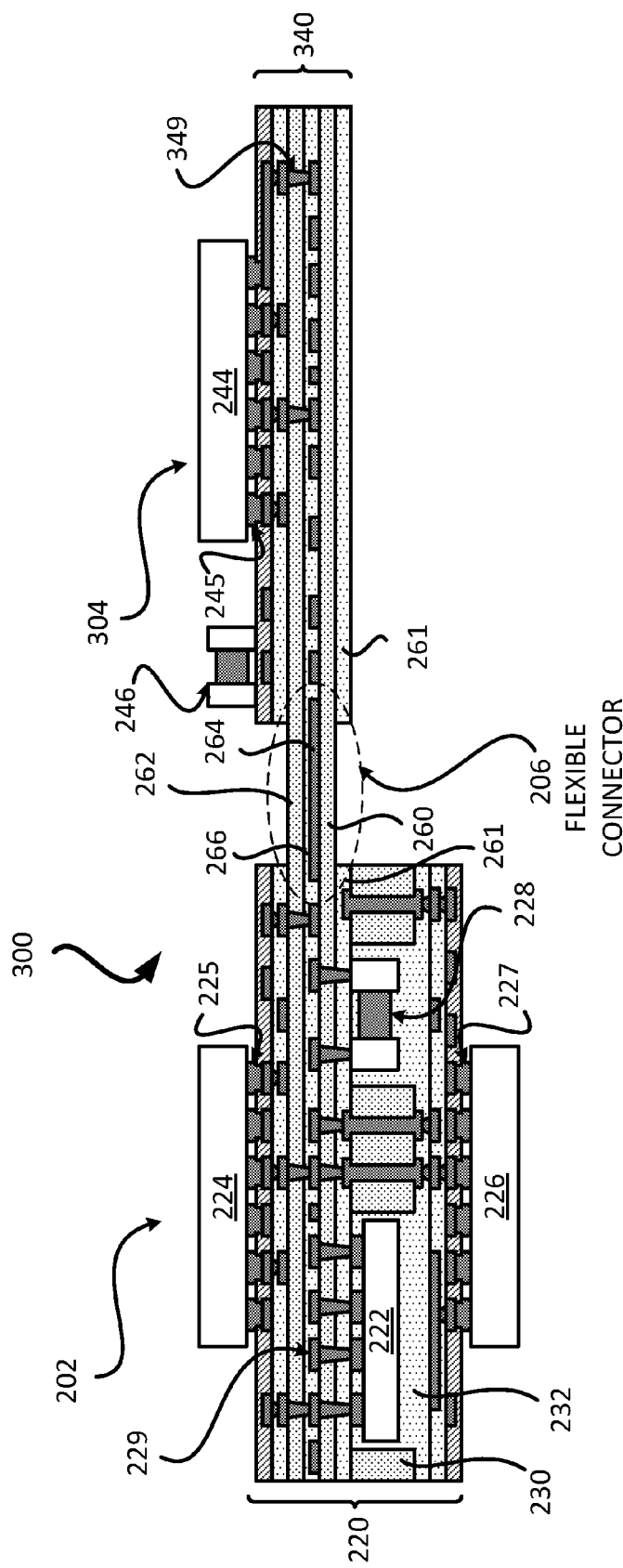
FIG. 3 illustrates a profile view of a device that includes two packages coupled together through a flexible connector.

FIG. 3 illustrates a integrated device 300 (e.g., integrated circuit (IC) device) that includes the first package 202 (e.g., first integrated circuit (IC) package), a second package 304 (e.g., second integrated circuit (IC) package) and the flexible connector 206. The first package 202 is coupled to the second package 304 through the flexible connector 206. The flexible connector 206 (e.g., means for electrical connecting between two packages) is configured to electrically couple the first package 202 to the second package 304. In particular, the flexible connector 206 is configured to electrically couple the first substrate 220 to the second substrate 340. In some implementations, the flexible connector 206 is embedded through a side portion of the first substrate 220 and a side portion of the second substrate 340.

FIG. 3 is similar to FIG. 2, except the second package 304 includes a second substrate 340 that is different than the second substrate 240 of FIG. 2. In particular, the second substrate 340 of FIG. 3 is a coreless substrate. That is, the second substrate 340 does not include a core layer.

As illustrated in FIG. 3, the second package 304 includes the second substrate 340, the fifth die 244, and the third passive component 246. The fifth die 244 is coupled to a first surface (e.g., top surface) of the second substrate 340 through the plurality of solder interconnects 245. The third passive component 246 is coupled to a first surface of the second substrate 340. In some implementations, the third passive component 246 is on a solder resist layer and/or an interconnect of the second substrate 340.

The second substrate 340 includes several dielectric layers (e.g., prepeg layer). The second substrate 340 also includes a plurality of second interconnects 349 that traverses the dielectric layers (e.g., second dielectric layer 262). The second substrate 340 also includes the first adhesive layer 261, the first dielectric layer 260, the second adhesive layer 266, the interconnect 264, the second dielectric layer 262. The first dielectric layer 260 and the second dielectric layer 262 may include a polyimide (PI) layer.

The flexible connector 206 is configured to electrically couple the first substrate 220 to the second substrate 340. The flexible connector 206 includes the first dielectric layer 260, the second dielectric layer 262, the interconnect 264, and the second adhesive layer 266. In some implementations, the flexible connector 206 is an asymmetrical flexible connector, where the number of dielectric layer is different than the number of adhesive layer. In the example of FIG. 3. the flexible connector 206 includes two dielectric layers and one adhesive layer.

As illustrated in FIG. 3, the first dielectric layer 260, the second dielectric layer 262, the interconnect 264, and/or the second adhesive layer 266 extend (e.g., substantially extend, about 25 percent or more, about 50 percent or more) into the first substrate 220 and the second substrate 340. For example, about 25 percent or more of the flexible connector 206 (e.g., first dielectric layer 260, the second dielectric layer 262, the interconnect 264, and/or the second adhesive layer 266) may be embedded in the first substrate 220 and/or the second substrate 340. In another example, about 25 percent or more of the length or width of the first substrate 220 and/or the length or width of the second substrate 340 may be shared with the flexible connector 206. Thus, in some implementations, the flexible connector 206 shares the first dielectric layer 260, the second dielectric layer 262, the interconnect 264, and the second adhesive layer 266 with the first substrate 220 and the second substrate 340.

In some implementations, one or more of the first dielectric layer 260, the second dielectric layer 262, the interconnect 264, and the second adhesive layer 266 contiguously extends through the flexible connector 206, the first substrate 220 and the second substrate 340. For example, the interconnect 264 may be formed contiguously in the flexible connector 206, the first substrate 220 and the second substrate 340. In such an instance, the interconnect 264 may be formed by one contiguous interconnect that is formed in the entire flexible connector 206, at least part of the first substrate 220 and at least part of the second substrate 340.

In another example, the first dielectric layer 260 (e.g., polyimide (P1) layer) may be formed by one contiguous dielectric layer that is formed in the entire flexible connector 206, at least part of the first substrate 220 and at least part of the second substrate 340. In some implementations, the first dielectric layer 260 may be one contiguous dielectric layer that traverses the entire (or substantially the entire) first substrate 220, the flexible connector 206 and the second substrate 340.

In some implementations, one or more of the first dielectric layer 260, the second dielectric layer 262, the interconnect 264, and the second adhesive layer 266 of the flexible connector 206 is substantially co-planar with a corresponding dielectric layer (e.g., internal dielectric layer), a corresponding interconnect (e.g., internal interconnect) or a corresponding adhesive layer (e.g., internal adhesive layer) of the first substrate 220 and/or the second substrate 340.

Exemplary Sequence for Fabricating an Integrated Device Comprising a Flexible Connector Between Packages In some implementations, providing/fabricating an integrated circuit (IC) device that includes an embedded flexible connector includes several processes. FIG. 4 (which includes FIGS. 4A-4E) illustrates an exemplary sequence for providing/fabricating integrated circuit (IC) device that includes an embedded flexible connector. In some implementations, the sequence of FIGS. 4A-4E may be used to fabricate the integrated circuit (IC) device that includes an embedded flexible connector of FIG. 2 and/or other integrated circuit (IC) devices described in the present disclosure. FIG. 4A-4E will now be described in the context of providing/fabricating the integrated circuit (IC) device of FIG. 2.

It should be noted that the sequence of FIGS. 4A-4E may combine one or more stages in order to simplify and/or clarify the sequence for providing integrated circuit (IC) device that includes an embedded flexible connector (e.g., means for electrical connecting between two packages). In some implementations, the order of the processes may be changed or modified.

Figure 4A:
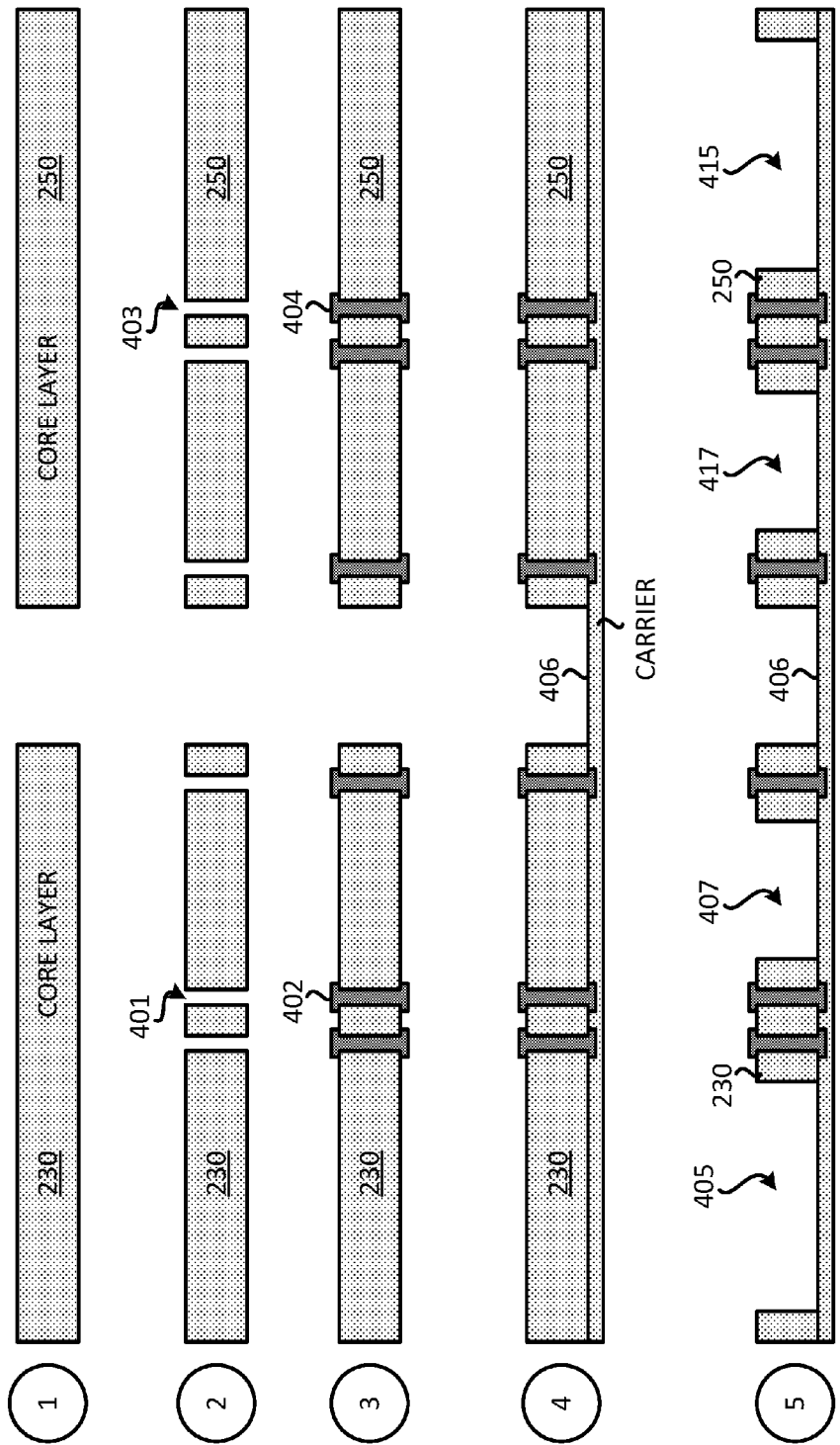
FIG. 4 (which comprises FIGS. 4A-4E) illustrates an example of a sequence for fabricating a device that includes two packages coupled together through a flexible connector.

Stage 1 of FIG. 4A, illustrates a state after a core layer 230 and a core layer 250 are provided. In some implementations, the core layer 230 and the core layer 250 are provided by a supplier or fabricated. In some implementations, the core layer 250 may be the same as the core layer 230.

Stage 2 illustrates at least one cavity 401 formed in the core layer 230, and at least one cavity 403 formed in core layer 250. Different implementations may form the cavities differently. In some implementations, a laser process may be used to form the cavities. It is noted that other cavities may be formed as well.

Stage 3 illustrates an interconnect 402 formed in the cavity 401, and an interconnect 404 formed in the cavity 403. An interconnect may include a via, a trace and/or a pad. Different implementations may form the interconnects differently. In some implementations, a lithography process may be used to form the interconnects. Examples of lithography processes include SAP, mSAP (e.g., modified SAP) and damascene.

Stage 4 illustrates the core layer 230 comprising the interconnect 402, and the core layer 250 comprising the interconnect 404 coupled to a carrier 406. The carrier 406 may be an adhesive lamination layer that provides a base for the core layer 230 and the core layer 250.

Stage 5 illustrates a cavity 405 and a cavity 407 formed in the core layer 230, and a cavity 415 and a cavity 417 formed in core layer 250. Different implementations may form the cavities differently. In some implementations, a laser process may be used to form the cavities.

Figure 4B:
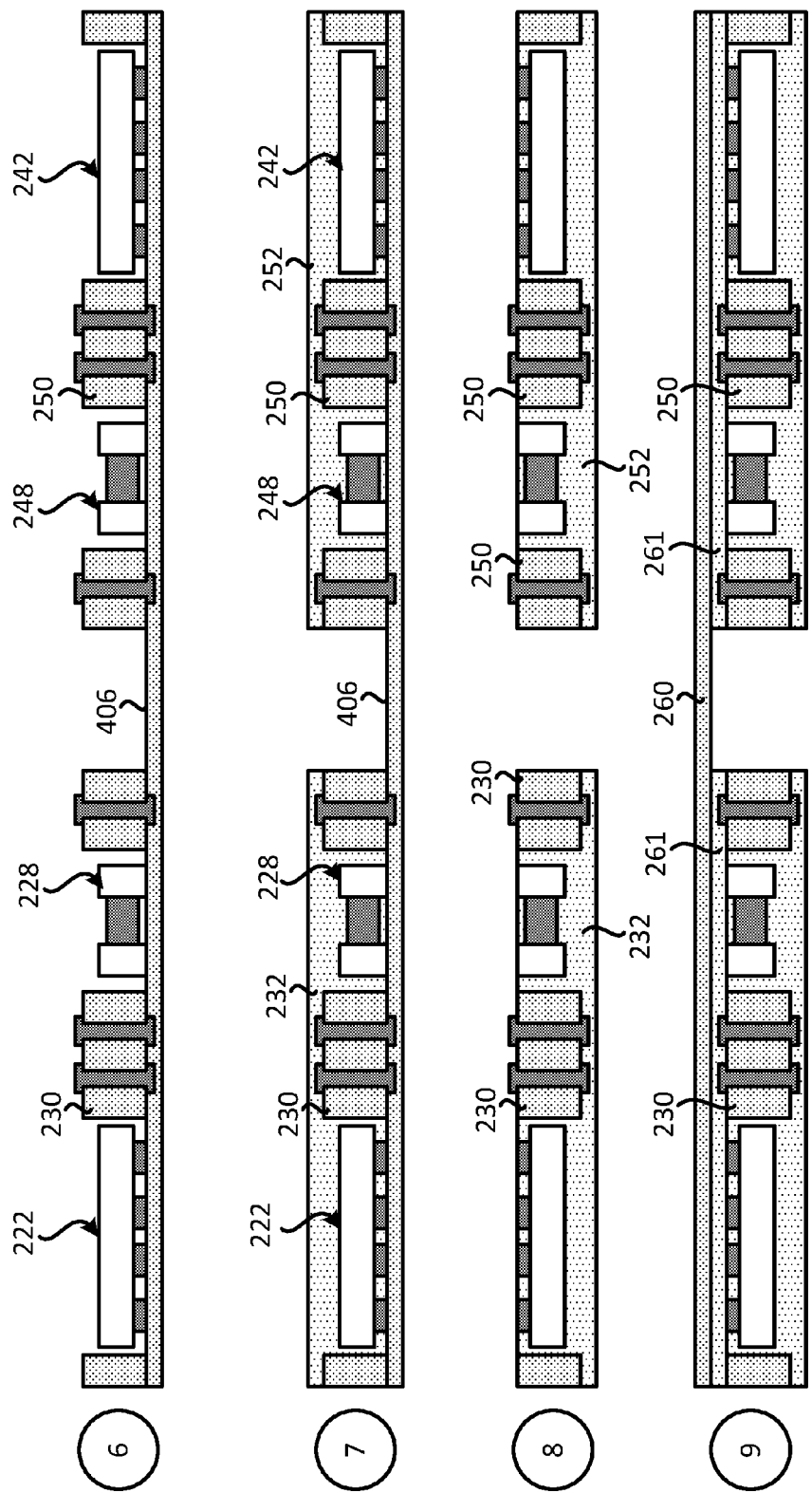

Stage 6 of FIG. 4B, illustrates the first die 222 provided (e.g., placed) in the cavity 405 and the first passive component 228 provided (e.g., placed) in the cavity 407. Stage 6 also illustrates the fourth die 242 provided in the cavity 415 and the second passive component 248 provided in the cavity 417.

Stage 7 illustrates the dielectric layer 232 formed over the cavity 405 and the cavity 407. The dielectric layer 232 encapsulates the first die 222 and the first passive component 228. Stage 7 also illustrates the dielectric layer 252 formed over the cavity 415 and the cavity 417. The dielectric layer 252 encapsulates the fourth die 242 and the second passive component 248. In some implementations, the dielectric layer 252 is the same as the dielectric layer 232. In some implementations, the dielectric layer 232 and the dielectric layer 252 include a prepeg layer.

Stage 8 illustrate the carrier 406 decoupled (e.g., detached, removed, detaped) from the core layer 230 and the core layer 250. In some implementations, the core layer 230 and the core layer 250 have been flipped over (e.g., flipped upside down).

Stage 9 illustrates a first adhesive layer 261 and a first dielectric layer 260 formed over the core layer 230 and the core layer 250. The first dielectric layer 260 may include a polyimide (PI) layer. In some implementations, the first dielectric layer 260 may be one contiguous dielectric layer that is formed over both the core layer 230 and the core layer 250. The first adhesive layer 261 may be one adhesive layer or several adhesive layers.

Figure 4C:
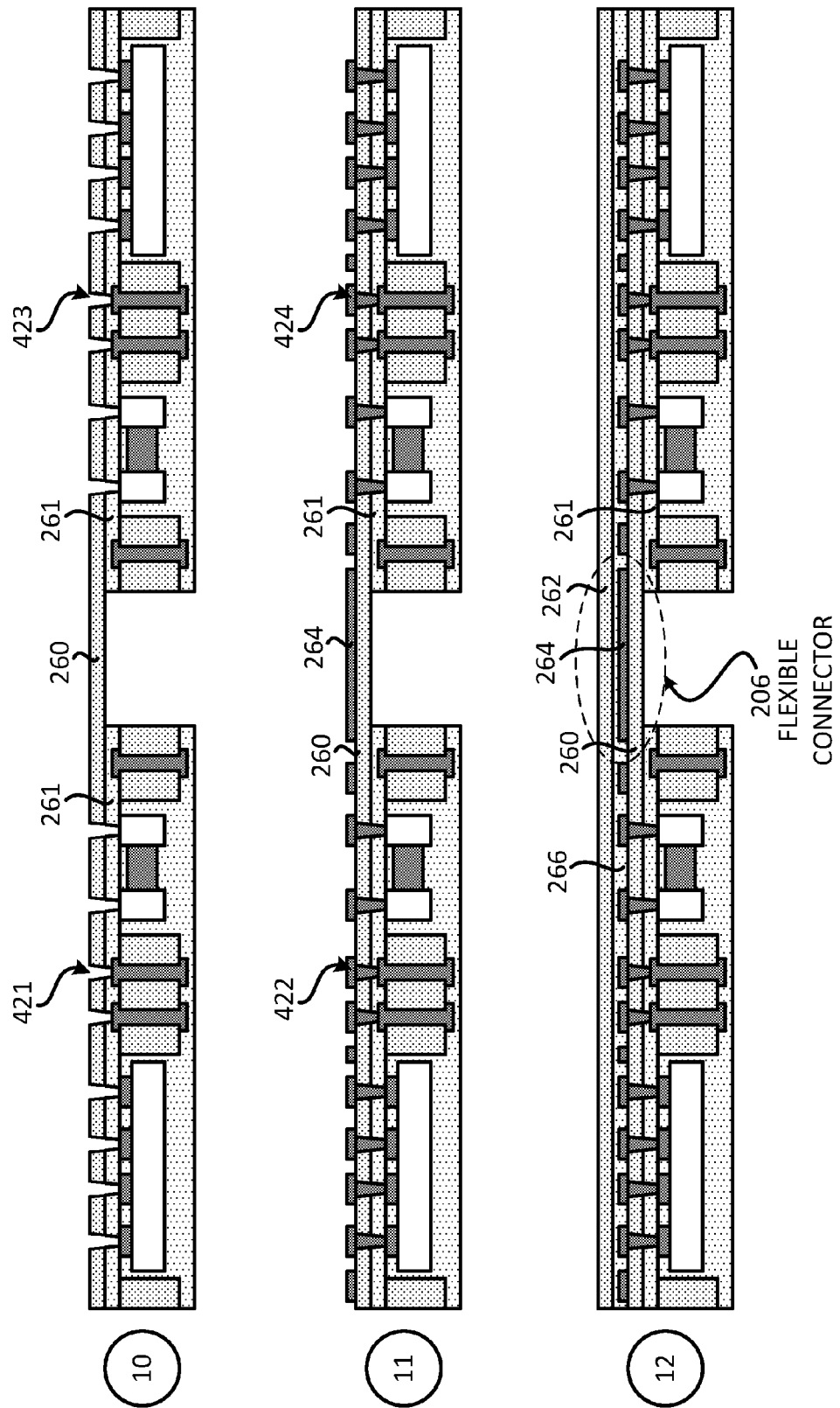

Stage 10 of FIG. 4C, illustrates at least one cavity 421 and at least one cavity 423 formed in the first adhesive layer 261 and the first dielectric layer 260. Different implementations may form the cavities differently. In some implementations, a laser process and/or a photo etching process may be used to form the cavities.

Stage 11 illustrates an interconnect 422, an interconnect 424, and interconnect 264 formed in and/or on the first dielectric layer 260. An interconnect may include a via, a trace and/or a pad. Different implementations may form the interconnects differently. In some implementations, interconnects may be formed using a lithography process that includes forming a seed layer, a lamination process, an exposure process, a developing process, a plating process, a strip process and an etching process (e.g., seed etching process).

Stage 12 illustrates the second adhesive layer 266 and the second dielectric layer 262 formed over the interconnect 422, the interconnect 424, and the interconnect 264. The second dielectric layer 262 may include a polyimide (PI) layer. In some implementations, the second dielectric layer 262 may be one contiguous dielectric layer that is formed over the second adhesive layer 266. Stage 12 illustrates the flexible connector 206 (e.g., means for electrical connecting between two packages) that includes the first dielectric layer 260, the second dielectric layer 262, the interconnect 264, and the second adhesive layer 266.

Figure 4D:
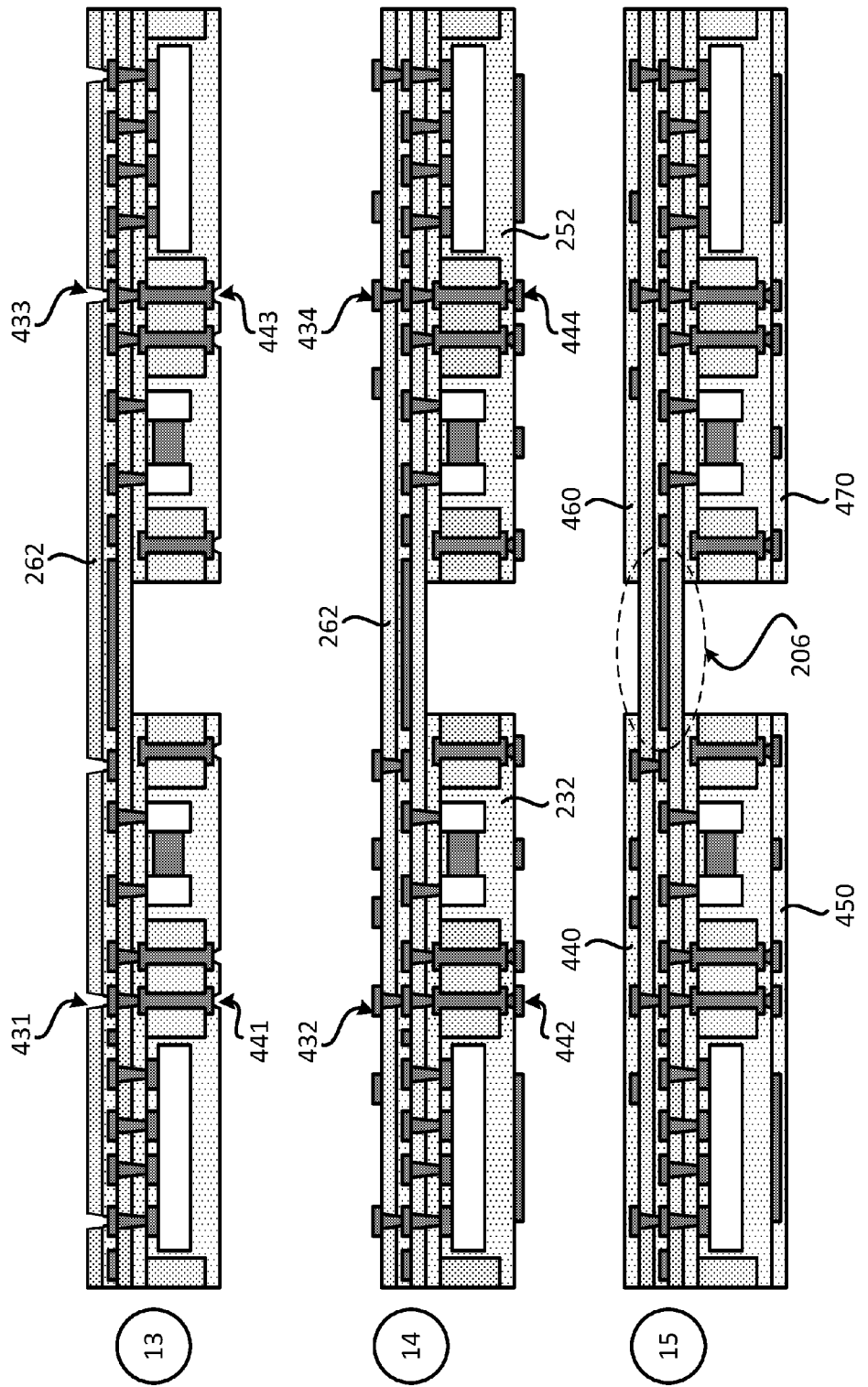

Stage 13 of FIG. 4D, illustrates at least one cavity 431 and at least one cavity 433 formed in the second adhesive layer 266 and the second dielectric layer 262. Stage 13 further illustrates at least one cavity 441 formed in the dielectric layer 232, and at least one cavity 443 formed in the dielectric layer 252. Different implementations may form the cavities differently. In some implementations, a laser process and/or a photo etching process may be used to form the cavities.

Stage 14 illustrates an interconnect 432 and an interconnect 434 formed in and/or on the second dielectric layer 262. An interconnect may include a via, a trace and/or a pad. Stage 14 also illustrates an interconnect 442 formed over the dielectric layer 232, and an interconnect 442 formed over the dielectric layer 252. Different implementations may form the interconnects differently. In some implementations, interconnects may be formed using a lithography process that includes forming a seed layer, a lamination process, an exposure process, a developing process, a plating process, a strip process and an etching process (e.g., seed etching process).

Stage 15 illustrates a dielectric layer 440 formed over the second dielectric layer 262. Stage 15 also illustrates a dielectric layer 450 formed over the dielectric layer 232. Stage 15 further illustrates a dielectric layer 460 formed over the second dielectric layer 262 and a dielectric layer 470 formed over the dielectric layer 252. In some implementations, the dielectric layer 440 and the dielectric layer 460 are the same dielectric layer. Similarly, in some implementations, the dielectric layer 450 and the dielectric layer 470 are the same dielectric layer.

Figure 4E:
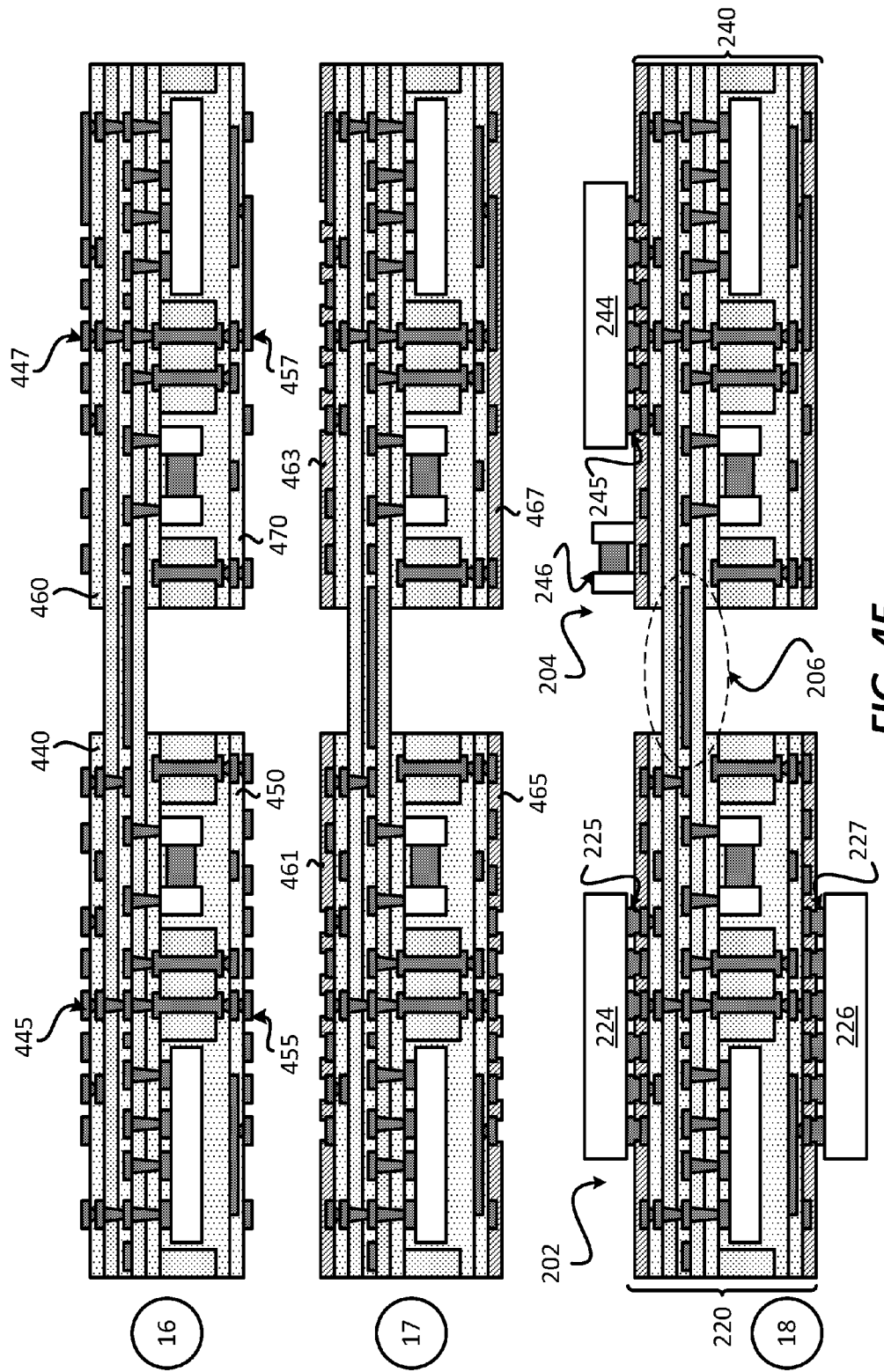

Stage 16 of FIG. 4E, illustrates an interconnect 445 formed in and/or on the dielectric layer 440, and the interconnect 447 formed in and/or on the dielectric layer 460. Stage 16 also illustrates an interconnect 455 formed in and/or on the dielectric layer 450, and the interconnect 457 formed in and/or on the dielectric layer 470. In some implementations, interconnects may be formed using a lithography process that includes forming a seed layer, a lamination process, an exposure process, a developing process, a plating process, a strip process and an etching process (e.g., seed etching process). The interconnect may include a via, a trace and/or a pad.

Stage 17 illustrates a solder resist layer 461, a solder resist layer 463, a solder resist layer 465, and a solder resist layer 467 formed on dielectric layers. The solder resist layer 461 is formed over the dielectric layer 440, and the solder resist layer 463 is formed over the dielectric layer 460. The solder resist layer 465 is formed over the dielectric layer 450, and the solder resist layer 467 is formed over the dielectric layer 470. Stage 17 illustrates the first substrate 220 and the second substrate 240 coupled through the flexible connector 206.

Stage 18 illustrates the second die 224 coupled to a first surface (e.g., top surface) of the first substrate 220, the third die 226 coupled to a second surface (e.g., bottom surface) of the first substrate 220. Stage 18 also illustrates the fifth die 244 coupled to a first surface (e.g., top surface) of the second substrate 240. In some implementations, stage 18 illustrates the integrated device 200 that includes the first package 202, the second package 204 and the flexible connector 206 of FIG. 2.

As mentioned above, the first package 202 includes the first substrate 220, the first die 222, the second die 224. the third die 226 and the first passive component 228. The first substrate 220 (which may include a laminated substrate and/or a printed circuit board) includes the core layer 230, the dielectric layer 232, the first dielectric layer 260, the second dielectric layer 262, the interconnect 264, the second adhesive layer 266, the dielectric layers 440, 450, the interconnects 422, 432, 442, 445, 455, and the solder resist layers 461 and 465. The first die 222 and the first passive component 228 may be located in the first substrate 220.

The second package 204 includes the second substrate 240, the fourth die 242. the second passive component 248, and the third passive component 246. The second substrate 240 (which may include a laminated substrate and/or a printed circuit board) includes the core layer 250, the dielectric layer 252, the first dielectric layer 260, the second dielectric layer 262, the interconnect 264, the second adhesive layer 266, the dielectric layers 460, 470, the interconnects 424, 434, 444, 447, 457, and the solder resist layers 463 and 467. The fourth die 242 and the second passive component 248 may be located in the second substrate 240. The third passive component 246 may be located on a surface of the second substrate 240 (e.g. surface of the solder resist layer 463 and/or an interconnect of the second substrate 240).

Exemplary Sequence for Fabricating an Integrated Device Comprising a Flexible Connector Between Packages In some implementations, providing/fabricating an integrated circuit (IC) device that includes an embedded flexible connector includes several processes. FIG. 5 (which includes FIGS. 5A-5E) illustrates an exemplary sequence for providing/fabricating integrated circuit (IC) device that includes an embedded flexible connector. In some implementations, the sequence of FIGS. 5A-5E may be used to fabricate the integrated circuit (IC) device that includes an embedded flexible connector of FIG. 3 and/or other integrated circuit (IC) devices described in the present disclosure. FIG. 5A-5E will now be described in the context of providing/fabricating the integrated circuit (IC) device of FIG. 3.

It should be noted that the sequence of FIGS. 5A-5E may combine one or more stages in order to simplify and/or clarify the sequence for providing integrated circuit (IC) device that includes an embedded flexible connector (e.g., means for electrical connecting between two packages). In some implementations, the order of the processes may be changed or modified.

Figure 5A:
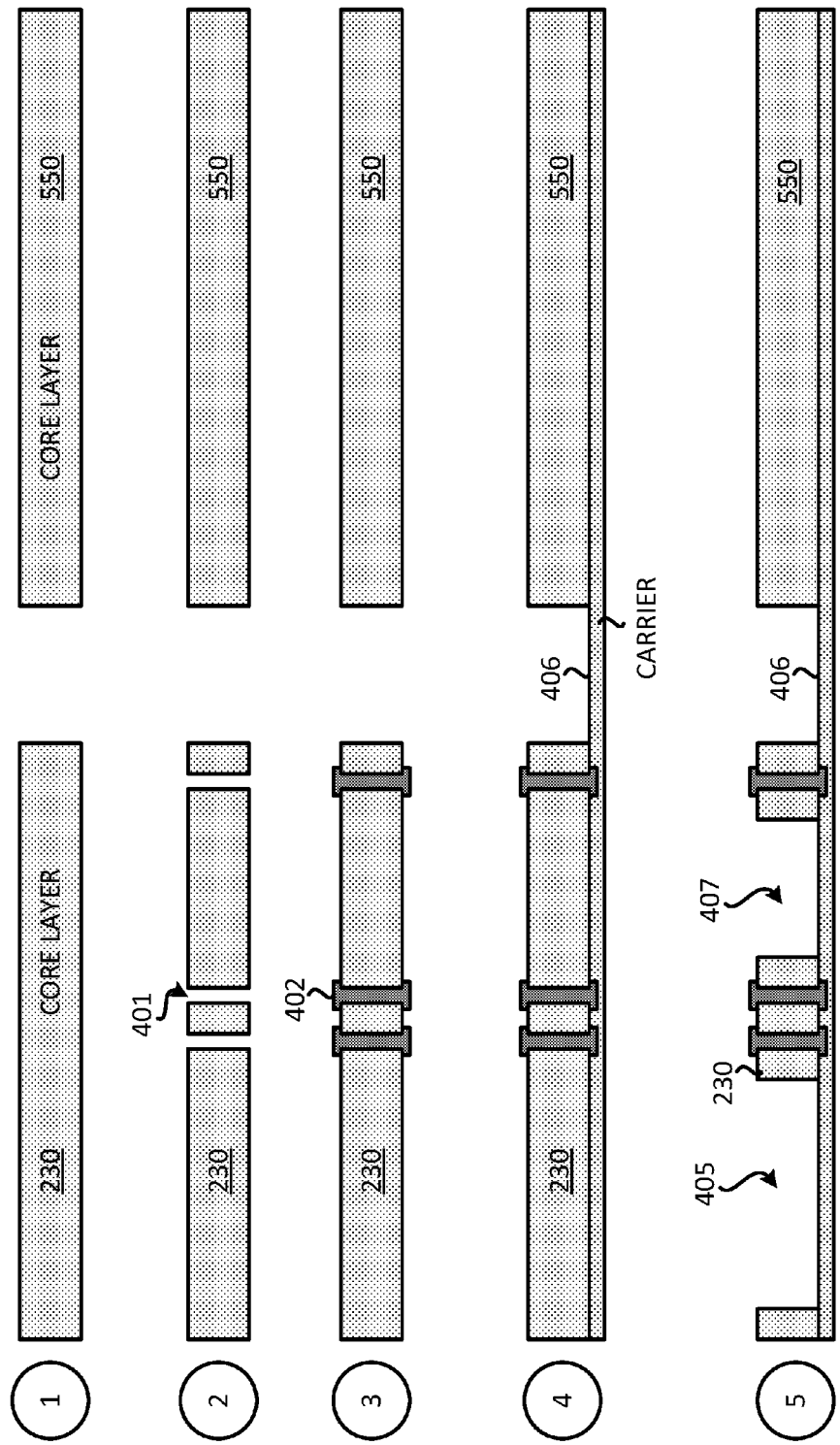
FIG. 5 (which comprises FIGS. 5A-5E) illustrates an example of a sequence for fabricating a device that includes two packages coupled together through a flexible connector.

Stage 1 of FIG. 5A, illustrates a state after a core layer 230 and a core layer 550 are provided. In some implementations, the core layer 230 and the core layer 550 are provided by a supplier or fabricated. In some implementations, the core layer 550 may be the same as the core layer 230.

Stage 2 illustrates at least one cavity 401 formed in the core layer 230. Different implementations may form the cavities differently. In some implementations, a laser process may be used to form the cavities. It is noted that other cavities may be formed as well.

Stage 3 illustrates an interconnect 402 formed in the cavity 401. An interconnect may include a via, a trace and/or a pad. Different implementations may form the interconnects differently. In some implementations, a lithography process may be used to form the interconnects. Examples of lithography processes include SAP, mSAP (e.g., modified SAP) and damascene.

Stage 4 illustrates the core layer 230 comprising the interconnect 402, coupled to a carrier 406. The carrier 406 may be an adhesive lamination layer that provides a base for the core layer 230 and the core layer 550.

Stage 5 illustrates a cavity 405 and a cavity 407 formed in the core layer 230. Different implementations may form the cavities differently. In some implementations, a laser process may be used to form the cavities.

Figure 5B:
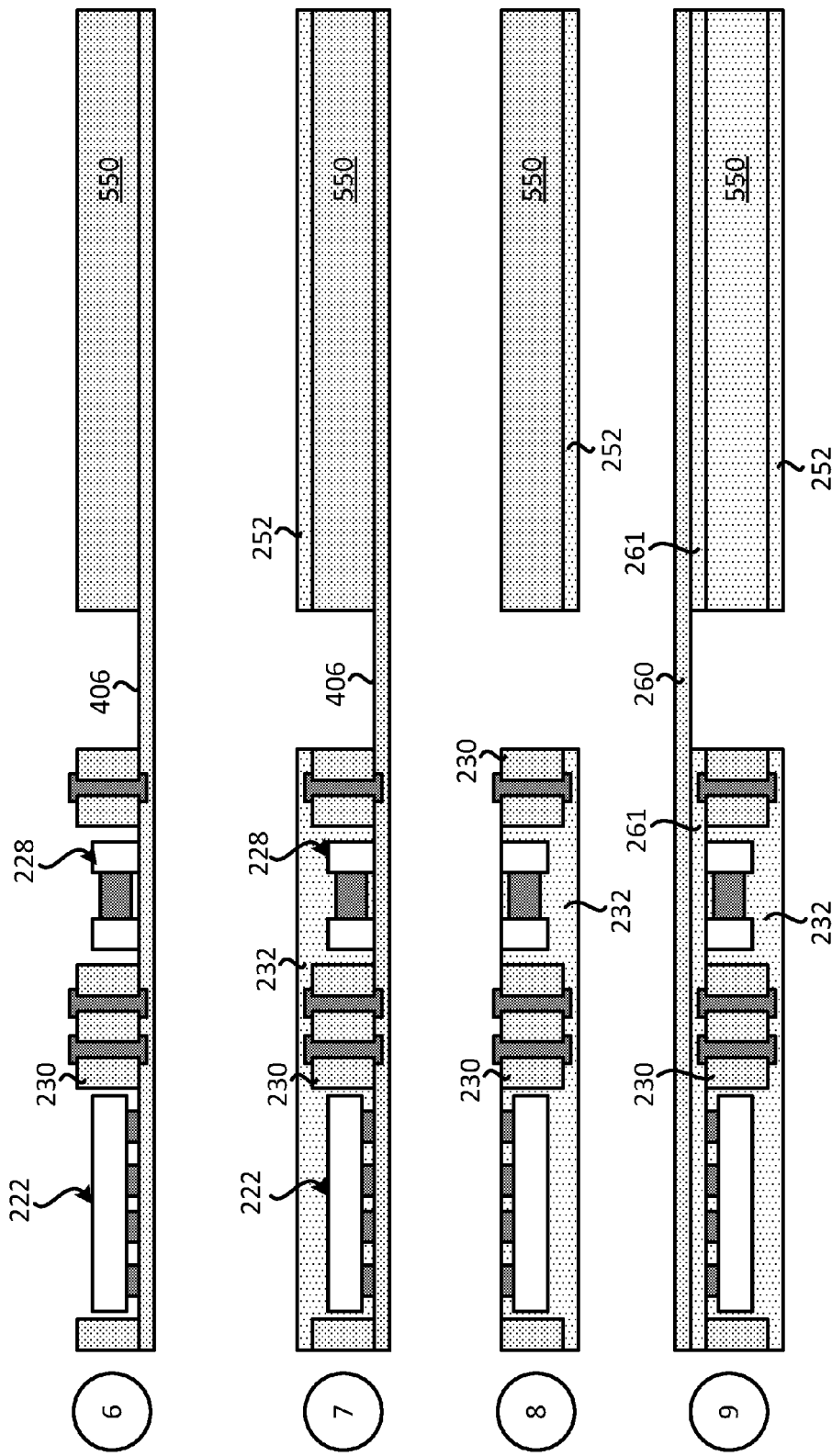

Stage 6 of FIG. 5B, illustrates the first die 222 provided (e.g., placed) in the cavity 405 and the first passive component 228 provided (e.g., placed) in the cavity 407.

Stage 7 illustrates the dielectric layer 232 formed over the cavity 405 and the cavity 407. The dielectric layer 232 encapsulates the first die 222 and the first passive component 228. Stage 7 also illustrates the dielectric layer 252 formed over the core layer 550. In some implementations, the dielectric layer 252 is the same as the dielectric layer 232. In some implementations, the dielectric layer 232 and the dielectric layer 252 include a prepeg layer.

Stage 8 illustrate the carrier 406 decoupled (e.g., detached, removed, detaped) from the core layer 230 and the core layer 550. In some implementations, the core layer 230 and the core layer 550 have been flipped over (e.g., flipped upside down).

Stage 9 illustrates a first adhesive layer 261 and a first dielectric layer 260 formed over the core layer 230 and the core layer 550. The first dielectric layer 260 may include a polyimide (PI) layer. In some implementations, the first dielectric layer 260 may be one contiguous dielectric layer that is formed over both the core layer 230 and the core layer 550. The first adhesive layer 261 may be one adhesive layer or several adhesive layers.

Figure 5C:
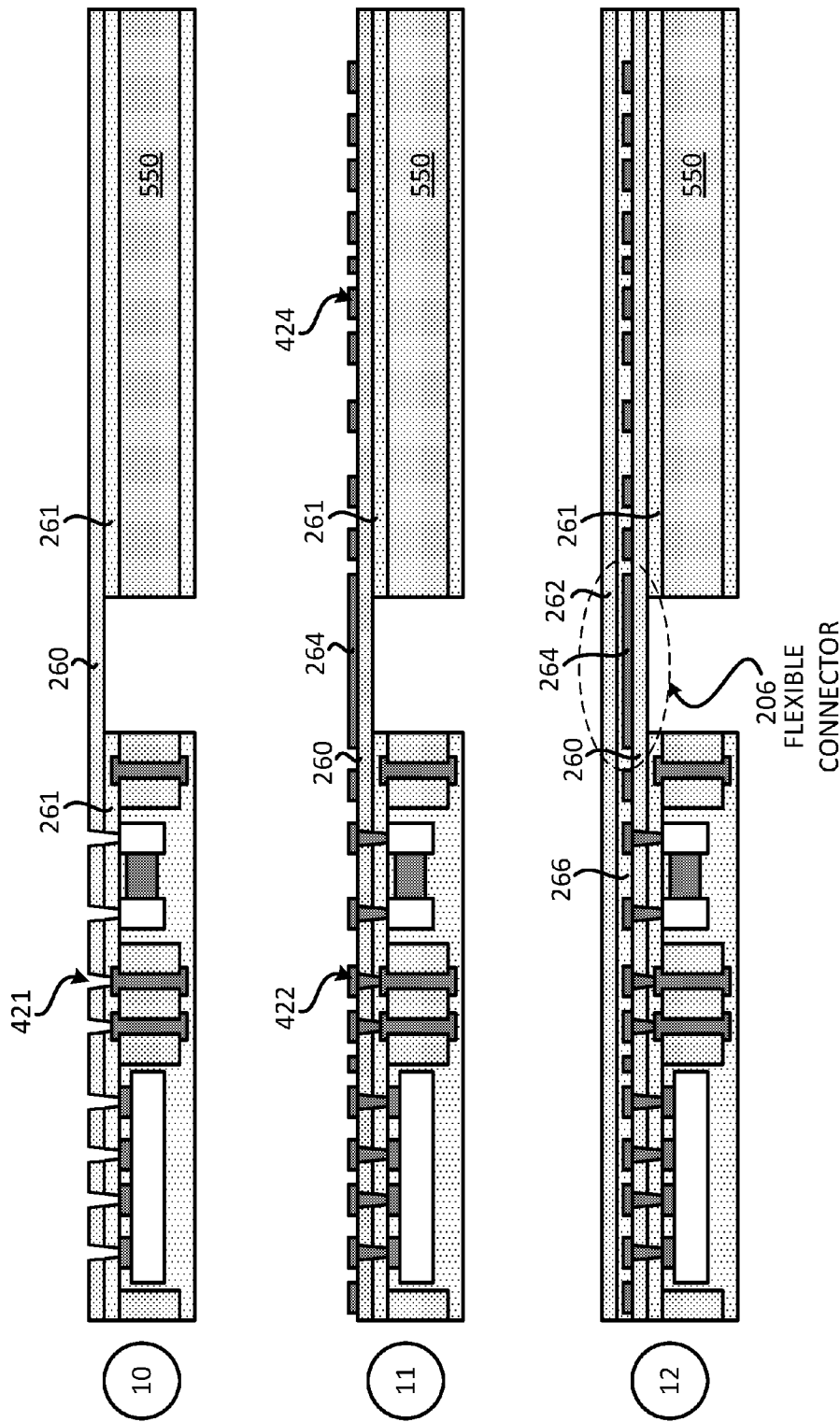

Stage 10 of FIG. 5C, illustrates at least one cavity 421 formed in the first adhesive layer 261 and the first dielectric layer 260. Different implementations may form the cavities differently. In some implementations, a laser process and/or a photo etching process may be used to form the cavities.

Stage 11 illustrates an interconnect 422, an interconnect 424, and interconnect 264 formed in and/or on the first dielectric layer 260. An interconnect may include a via, a trace and/or a pad. Different implementations may form the interconnects differently. In some implementations, interconnects may be formed using a lithography process that includes forming a seed layer, a lamination process, an exposure process, a developing process, a plating process, a strip process and an etching process (e.g., seed etching process).

Stage 12 illustrates the second adhesive layer 266 and the second dielectric layer 262 formed over the interconnect 422, the interconnect 424, and the interconnect 264. The second dielectric layer 262 may include a polyimide (PI) layer. In some implementations, the second dielectric layer 262 may be one contiguous dielectric layer that is formed over the second adhesive layer 266. Stage 12 illustrates the flexible connector 206 (e.g., means for electrical connecting between two packages) that includes the first dielectric layer 260, the second dielectric layer 262, the interconnect 264, and the second adhesive layer 266.

Figure 5D:
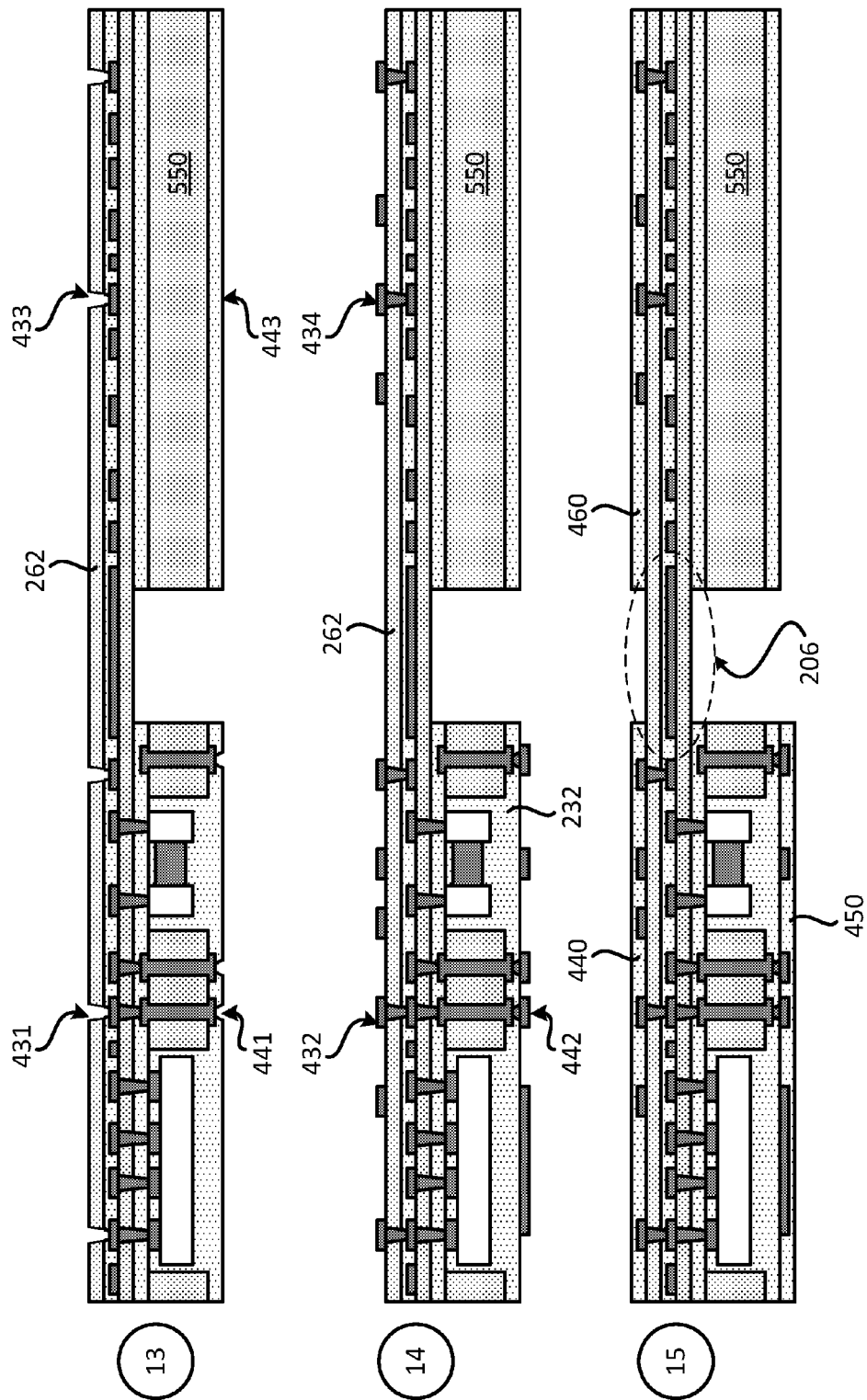

Stage 13 of FIG. 5D, illustrates at least one cavity 431 and at least one cavity 433 formed in the second adhesive layer 266 and the second dielectric layer 262. Stage 13 further illustrates at least one cavity 441 formed in the dielectric layer 232, and at least one cavity 443 formed in the dielectric layer 252. Different implementations may form the cavities differently. In some implementations, a laser process and/or a photo etching process may be used to form the cavities.

Stage 14 illustrates an interconnect 432 and an interconnect 434 formed in and/or on the second dielectric layer 262. An interconnect may include a via, a trace and/or a pad. Stage 14 also illustrates an interconnect 442 formed over the dielectric layer 232. Different implementations may form the interconnects differently. In some implementations, interconnects may be formed using a lithography process that includes forming a seed layer, a lamination process, an exposure process, a developing process, a plating process, a strip process and an etching process (e.g., seed etching process).

Stage 15 illustrates a dielectric layer 440 formed over the second dielectric layer 262. Stage 15 also illustrates a dielectric layer 450 formed over the dielectric layer 232. Stage 15 further illustrates a dielectric layer 460 formed over the second dielectric layer 262. In some implementations, the dielectric layer 440 and the dielectric layer 460 are the same dielectric layer.

Figure 5E:
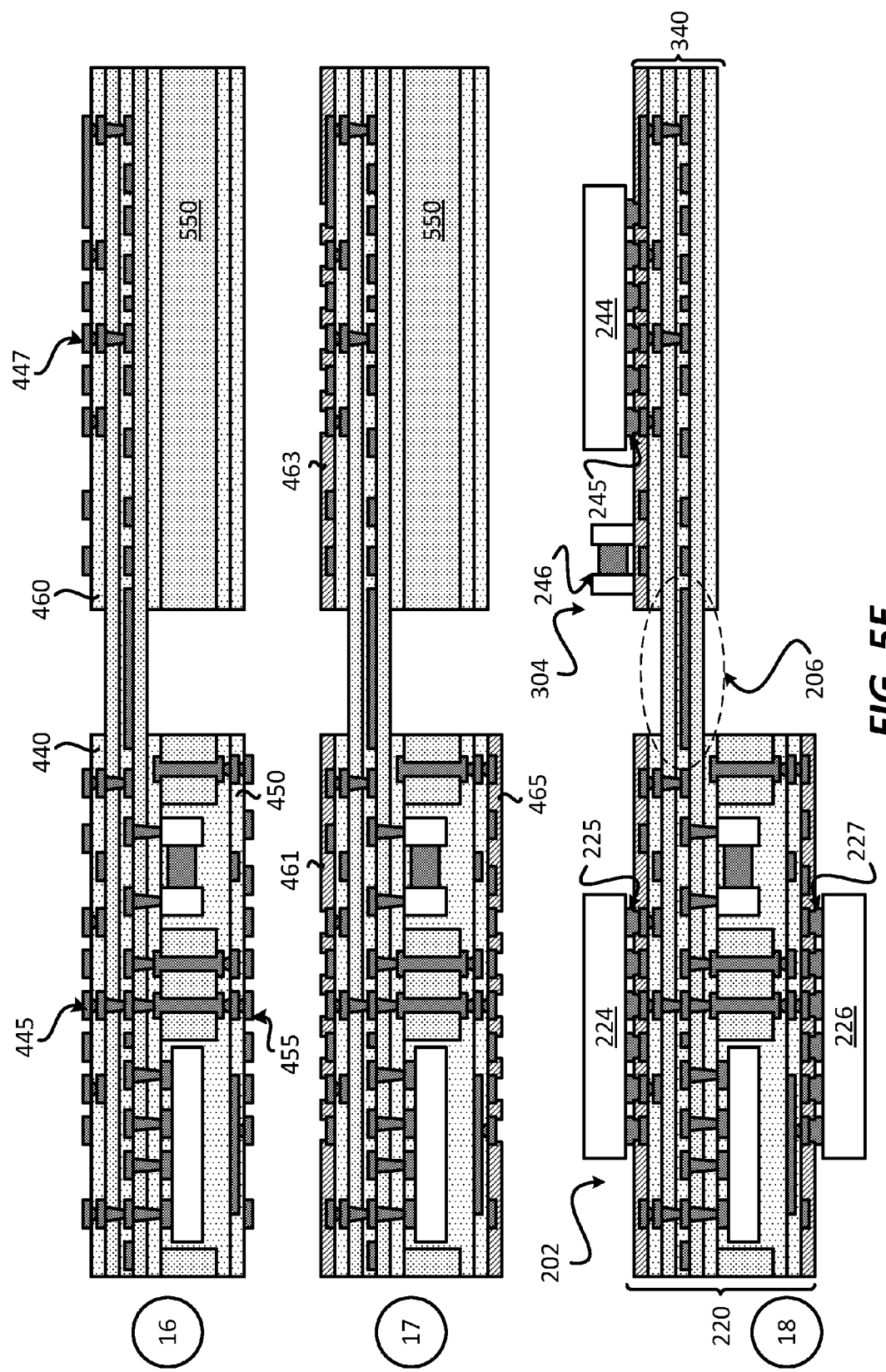

Stage 16 of FIG. 5E, illustrates an interconnect 445 formed in and/or on the dielectric layer 440, and an interconnect 447 formed in and/or on the dielectric layer 460. Stage 16 also illustrates an interconnect 455 in and/or on the dielectric layer 450. In some implementations, interconnects may be formed using a lithography process that includes forming a seed layer, a lamination process, an exposure process, a developing process, a plating process, a strip process and an etching process (e.g., seed etching process). The interconnect may include a via, a trace and/or a pad.

Stage 17 illustrates a solder resist layer 461, a solder resist layer 463, and a solder resist layer 465 formed on dielectric layers. The solder resist layer 461 is formed over the dielectric layer 440. The solder resist layer 463 is formed over the dielectric layer 460. The solder resist layer 465 is formed over the dielectric layer 450. Stage 17 illustrates the first substrate 220 and the second substrate 240 coupled through the flexible connector 206.

Stage 18 illustrates the second die 224 coupled to a first surface (e.g., top surface) of the first substrate 220, the third die 226 coupled to a second surface (e.g., bottom surface) of the first substrate 220. Stage 18 also illustrates the fifth die 244 coupled to a first surface (e.g., top surface) of the second substrate 340. Stage 18 further illustrates the core layer 550 decoupled (e.g., detached, removed) from the first adhesive layer 261. The second substrate 340 is a coreless substrate. In some implementations, stage 18 illustrates the integrated device 300 that includes the first package 202, the second package 304 and the flexible connector 206 of FIG. 3.

Figure 6:
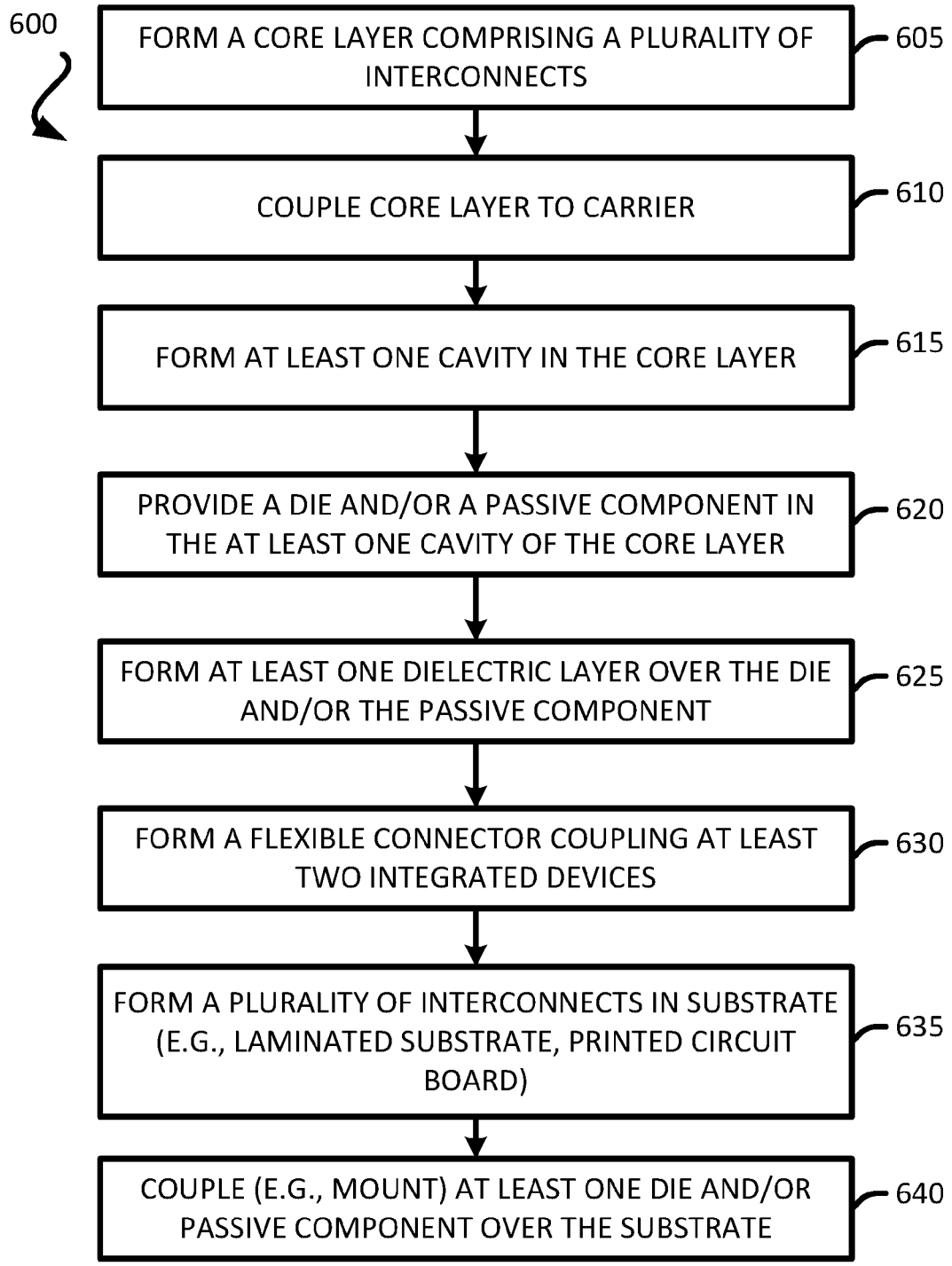
FIG. 6 illustrates a flow diagram of an exemplary method for fabricating a device that includes two packages coupled together through a flexible connector.

Exemplary Method for Fabricating an Integrated Device Comprising a Flexible Connector Between Packages In some implementations, providing/fabricating an integrated circuit (IC) device that includes an embedded flexible connector includes several processes. FIG. 6 illustrates an exemplary flow diagram of a method 600 for providing/fabricating integrated circuit (IC) device that includes an embedded flexible connector. In some implementations, the method of FIG. 6 may be used to fabricate the integrated circuit (IC) device that includes an embedded flexible connector of FIGS. 2-3 and/or other integrated circuit (IC) devices described in the present disclosure. FIG. 6 will be described in the context of fabricating the integrated circuit (IC) device of FIG. 2.

It should be noted that the flow diagram of FIG. 6 may combine one or more processes in order to simplify and/or clarify the method for providing an integrated circuit (IC) device. In some implementations, the order of the processes may be changed or modified.

The method forms (at 605) a core layer that includes a plurality of interconnects. In some implementations, forming the core layer (e.g., core layer 230) includes forming a cavity and forming (e.g., using a lithography process) an interconnect in the cavity.

The method couples (at 610) the core layer to a carrier. In some implementations, the carrier (e.g., carrier 406) is an adhesive lamination layer.

The method forms (at 615) at least one cavity in the core layer. In some implementations, the cavity (e.g., cavity 405) may be used to place a die and/or a passive component in the core layer.

The method provides (at 620) a die (e.g. first die 222) and/or a passive component (e.g., first passive component 228) in one or more cavities of the core layer (e.g., core layer 230).

The method forms (at 625) at least dielectric layer over the die and/or the passive component. For example, the method forms the dielectric layer 232 over the first die 222 and the first passive component 228.

The method forms (at 630) a flexible connector coupling at least two integrated devices. In some implementations, the method forms the flexible connector 206 (e.g., means for electrical connecting between two packages) that includes an adhesive layer, a dielectric layer (e.g., polyimide (PI) layer), and an interconnect.

The method forms (at 635) a plurality of interconnects in a substrate. In some implementations, the plurality of interconnects may be formed using a lithography process that includes forming a seed layer, a lamination process, an exposure process, a developing process, a plating process, a strip process and an etching process (e.g., seed etching process). In some implementations, the lithography process may be iteratively performed for several layers of a substrate. The substrate may include a laminated substrate and/or a printed circuit board (PCB) process. The method may also form a solder resist layer on a top surface and/or a bottom surface of the substrate.

The method couples (at 640) one more dies and/or one more passive devices on a surface of a substrate. In some implementations, coupling one or more dies and/or one more passive devices include using surface mounting technology (SMT) process to mount a die and/or a passive component on a surface of the substrate. The die and/or passive component can be mounted on a top surface and/or a bottom surface of the substrate. In some implementations, a solder interconnect (e.g., solder ball) may be used to couple the die and/or the passive component to the substrate.

Exemplary Integrated Device Comprising a Flexible Connector Between Packages

Figure 7:
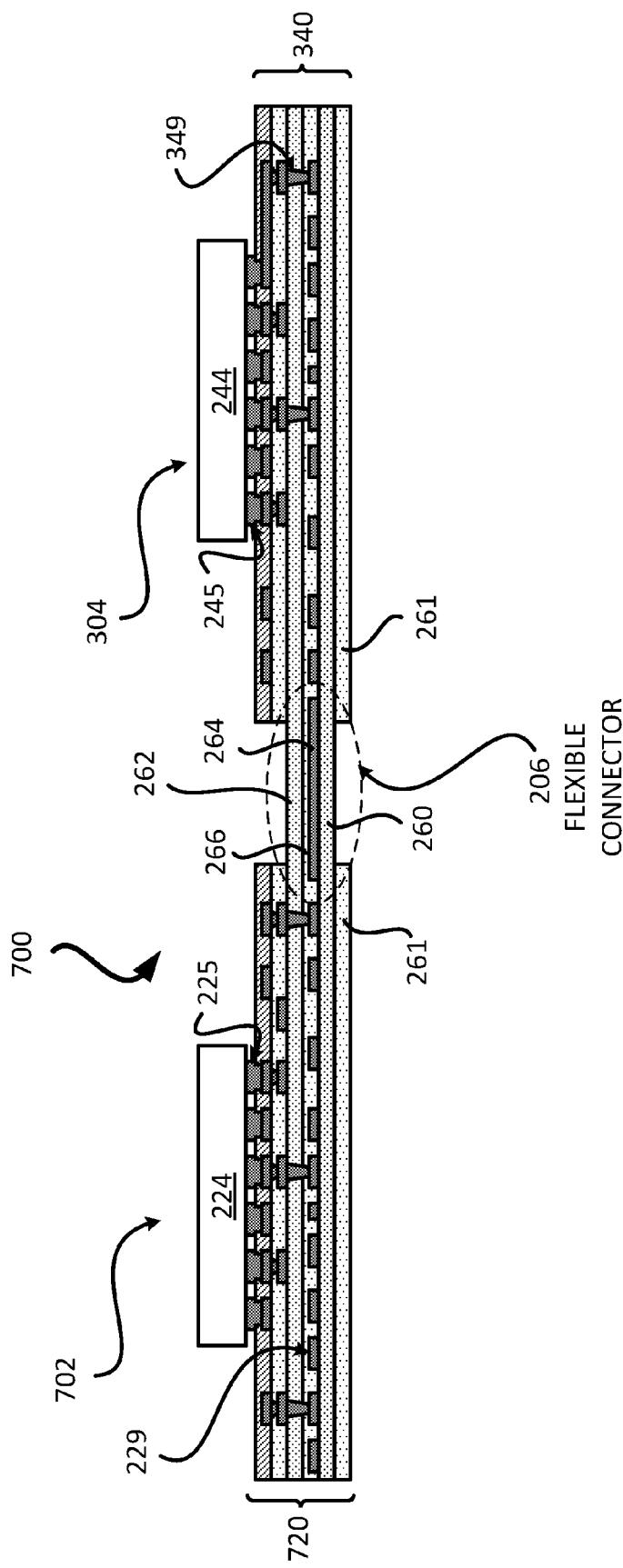
FIG. 7 illustrates a profile view of a device that includes two packages coupled together through a flexible connector.

FIG. 7 illustrates an integrated device 700 (e.g., integrated circuit (IC) device) that includes a first package 702 (e.g., first integrated circuit (IC) package), the second package 304 (e.g., second integrated circuit (IC) package) and the flexible connector 206. The first package 702 is coupled to the second package 304 through the flexible connector 206. FIG. 7 is similar to FIG. 3, except the first package 702 includes a first substrate 720 that is different than the first substrate 220 of FIG. 3. In particular, the first substrate 720 of FIG. 7 is a coreless substrate. That is, the first substrate 720 does not include a core layer.

The first package 702 includes a first substrate 720. The first substrate 220 includes the first adhesive layer 261, the first dielectric layer 260, the second adhesive layer 266, the interconnect 264, the second dielectric layer 262. The first dielectric layer 260 and the second dielectric layer 262 may include a polyimide (PI) layer. The first substrate 720 may also include a plurality of dielectric layers and a plurality of first interconnects 229. The plurality of dielectric layers may include a prepeg layer. The second die 224 is coupled to a first surface (e.g., top surface) of the first substrate 720.

The flexible connector 206 is configured to electrically couple the first substrate 720 to the second substrate 340. The flexible connector 206 includes the first dielectric layer 260, the second dielectric layer 262, the interconnect 264, and the second adhesive layer 266. In some implementations, the flexible connector 206 is embedded through a side portion of the first substrate 720 and a side portion of the second substrate 340.

As shown in FIG. 7, the first dielectric layer 260, the second dielectric layer 262, the interconnect 264, and/or the second adhesive layer 266 extend (e.g., substantially extend, about 25 percent or more, about 50 percent or more) into the first substrate 720 and the second substrate 340. For example, about 25 percent or more of the flexible connector 206 (e.g., first dielectric layer 260, the second dielectric layer 262, the interconnect 264, and/or the second adhesive layer 266) may be embedded in the first substrate 720 and/or the second substrate 340. In another example, about 25 percent or more of the length or width of the first substrate 720 and/or the length or width of the second substrate 340 may be shared with the flexible connector 206. Thus, in some implementations, the flexible connector 206 shares the first dielectric layer 260, the second dielectric layer 262, the interconnect 264, and the second adhesive layer 266 with the first substrate 720 and the second substrate 340.

In some implementations, one or more of the first dielectric layer 260, the second dielectric layer 262, the interconnect 264, and the second adhesive layer 266 contiguously extends through the flexible connector 206, the first substrate 720 and the second substrate 340. For example, the interconnect 264 may be formed contiguously in the flexible connector 206, the first substrate 720 and the second substrate 340. In such an instance, the interconnect 264 may be formed by one contiguous interconnect that is formed in the entire flexible connector 206, at least part of the first substrate 720 and at least part of the second substrate 340.

In another example, the first dielectric layer 260 (e.g., polyimide (PI) layer) may be formed by one contiguous dielectric layer that is formed in the entire flexible connector 206, at least part of the first substrate 720 and at least part of the second substrate 340. In some implementations, the first dielectric layer 260 may be one contiguous dielectric layer that traverses the entire (or substantially the entire) first substrate 720, the flexible connector 206 and the second substrate 340.

In some implementations, one or more of the first dielectric layer 260, the second dielectric layer 262, the interconnect 264, and the second adhesive layer 266 of the flexible connector 206 is substantially co-planar with a corresponding dielectric layer (e.g., internal dielectric layer), a corresponding interconnect (e.g., internal interconnect) or a corresponding adhesive layer (e.g., internal adhesive layer) of the first substrate 720 and/or the second substrate 340.

Exemplary Electronic Devices

Figure 8:
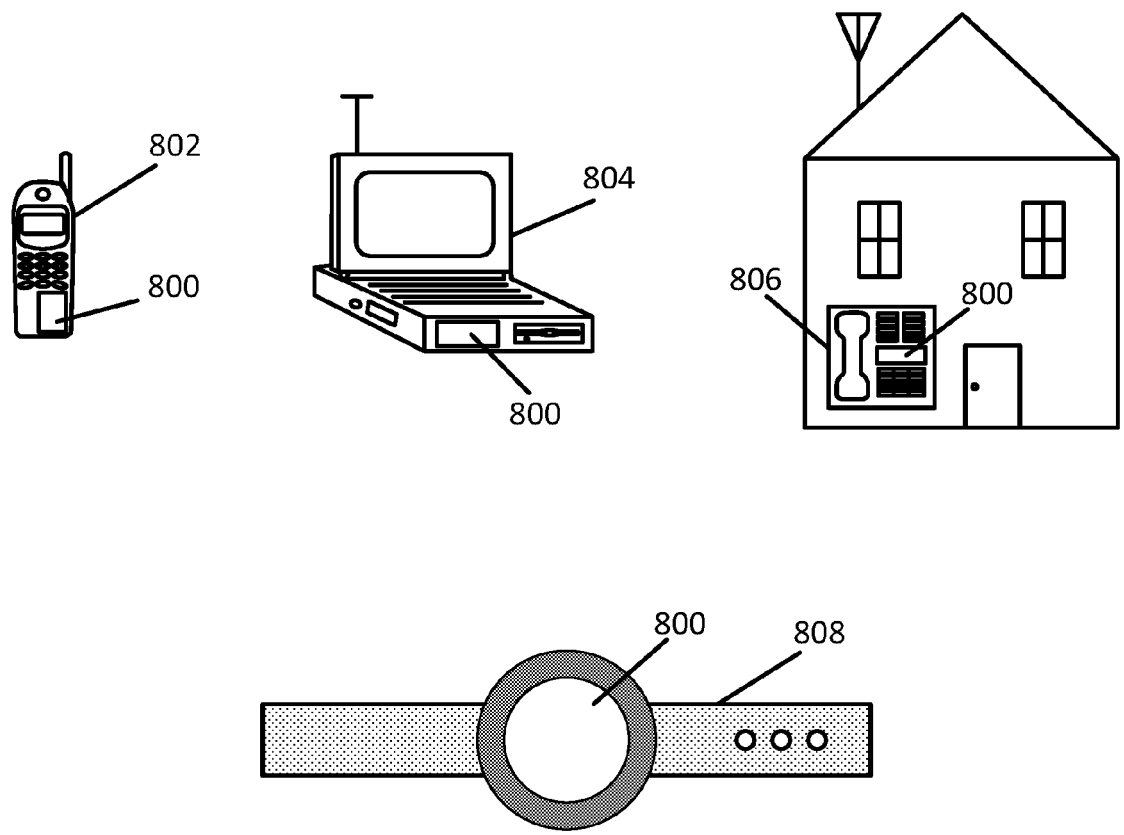
FIG. 8 illustrates various electronic devices that may include the various integrated devices, integrated device packages, semiconductor devices, dies, integrated circuits, and/or packages described herein.

FIG. 8 illustrates various electronic devices that may be integrated with any of the aforementioned integrated device, semiconductor device, integrated circuit, die, interposer, package or package-on-package (PoP). For example, a mobile phone device 802, a laptop computer device 804, a fixed location terminal device 806, a wearable device 808 may include an integrated device 800 as described herein. The integrated device 800 may be, for example, any of the integrated circuits, dies, integrated devices, integrated device packages, integrated circuit devices, device packages, integrated circuit (IC) packages, package-on-package devices described herein. The devices 802, 804, 806, 808 illustrated in FIG. 8 are merely exemplary. Other electronic devices may also feature the integrated device 800 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watch, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 2, 3, 4A-4E, 5A-5E, 6, 7, and/or 8 may be rearranged and/or combined into a single component, process, feature or function or embodied in several components, processes, or functions. Additional elements, components, processes, and/or functions may also be added without departing from the disclosure. It should also be noted that FIGS. 2, 3, 4A-4E, 5A-5E, 6, 7, and/or 8 and its corresponding description in the present disclosure is not limited to dies and/or ICs. In some implementations, FIGS. 2, 3, 4A-4E, 5A-5E, 6, 7, and/or 8 and its corresponding description may be used to manufacture, create, provide, and/or produce integrated devices. In some implementations, a device may include a die, an integrated device, a die package, an integrated circuit (IC), a device package, an integrated circuit (IC) package, a wafer, a semiconductor device, a package on package (PoP) device, and/or an interposer.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another-even if they do not directly physically touch each other.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. An integrated device comprising:
   a first integrated circuit (IC) package comprising a first laminated substrate, wherein the first laminated substrate includes a die;
   a flexible connector coupled to the first laminated substrate, wherein the flexible connector comprises a dielectric layer and an interconnect; and
   a second integrated circuit (IC) package comprising a second laminated substrate, wherein the second laminated substrate is coupled to the flexible connector,
   wherein the dielectric layer and the interconnect substantially extend into the first laminated substrate and the second laminated substrate,
   wherein the dielectric layer of the flexible connector is non-planar with the die of the first integrated circuit (IC) package.

2. The integrated device of claim 1, wherein the dielectric layer and the interconnect of the flexible connector, contiguously extend into the first laminated substrate and the second laminated substrate.

3. The integrated device of claim 1, wherein the dielectric layer extends into a substantial portion of the first laminated substrate.

4. The integrated device of claim 1, wherein the first laminated substrate includes a core layer that is substantially co-planar with the die, and wherein the dielectric layer of the flexible connector extends into the first laminated substrate such that the dielectric layer is over the core layer, the core layer being separate from the flexible connector.

5. The integrated device of claim 1, wherein the flexible connector comprises an adhesive layer, and wherein the flexible connector is an asymmetrical flexible connector comprising a number of dielectric layer that is different than a number of adhesive layer.

6. The integrated device of claim 1, wherein the dielectric layer comprises a polyimide (PI) layer.

7. The integrated device of claim 1, wherein the flexible connector is non-planar with the die of the first integrated circuit (IC) package.

8. The integrated device of claim 1, wherein the first integrated circuit (IC) package further comprises a second die that is coupled over a surface of the first laminated substrate, the second die located on a different layer than the flexible connector.

9. The integrated device of claim 1, wherein the die is embedded in the first laminated substrate such that the die is separate from the flexible connector, and such that the die is on a different layer than the flexible connector.

10. The integrated device of claim 1, wherein the first integrated circuit (IC) package comprises a passive component.

11. The integrated device of claim 1, wherein the first laminated substrate includes a printed circuit board (PCB).

12. The integrated device of claim 1, wherein the integrated device is incorporated into a device selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, and a device in an automotive vehicle.

13. The integrated device of claim 1, wherein the first integrated circuit (IC) package includes a second dielectric layer that encapsulates the die, the second dielectric being separate from the flexible connector.

14. An apparatus comprising:
a first integrated circuit (IC) package comprising a first laminated substrate, wherein the first laminated substrate includes a die;
a means for electrical connecting coupled to the first laminated substrate; and
a second integrated circuit (IC) package comprising a second laminated substrate, wherein the second laminated substrate is coupled to the means for electrical connecting,
wherein the means for electrical connecting substantially extends into the first laminated substrate and the second laminated substrate,
wherein the means for electrical connecting is non-planar with the die of the first integrated circuit (IC) package.

15. The apparatus of claim 14, wherein the means for electrical connecting contiguously extends into the first laminated substrate and the second laminated substrate.

16. The apparatus of claim 14, wherein the means for electrical connecting comprises a dielectric layer and an interconnect, and wherein the dielectric layer extends into a substantial portion of the first laminated substrate.

17. The apparatus of claim 16, wherein the first laminated substrate includes a core layer that is substantially co-planar with the die, and wherein the dielectric layer of the means for electrical connecting extends into the first laminated substrate such that the dielectric layer is over the core layer, the core layer being separate from the means for electrical connecting.

18. The apparatus of claim 14, wherein the dielectric layer comprises a polyimide (PI) layer.

19. The apparatus of claim 14, wherein the means for electrical connecting comprises an adhesive layer, and wherein the means for electrical connecting is an asymmetrical means for electrical connecting comprising a number of dielectric layer that is different than a number of adhesive layer.

20. The apparatus of claim 14, wherein the second integrated circuit (IC) package comprises a second die.

21. The apparatus of claim 14, further comprising a second die that is coupled over a surface of the first laminated substrate.

22. The apparatus of claim 14, wherein the die is embedded in the first laminated substrate such that the die is separate from the means for electrical connecting, and such that the die is on a different layer than the means for electrical connecting.

23. The apparatus of claim 14, wherein the first integrated circuit (IC) package comprises a passive component.

24. The apparatus of claim 14, wherein the first laminated substrate includes a printed circuit board (PCB).

25. The apparatus of claim 14, wherein the apparatus is incorporated into a device selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, and a device in an automotive vehicle.

26. A method for fabricating an integrated device, comprising:
forming a first integrated circuit (IC) package comprising a first laminated substrate, wherein forming the first integrated circuit (IC) package comprises providing the first laminated substrate that includes a die;
forming a flexible connector coupled to the first laminated substrate, wherein forming the flexible connector comprises forming a dielectric layer and an interconnect; and
forming a second integrated circuit (IC) package comprising a second laminated substrate, wherein forming the second laminated substrate comprises coupling the second laminated substrate to the flexible connector,
wherein the dielectric layer and the interconnect are formed such that the dielectric layer and the interconnect substantially extend into the first laminated substrate and the second laminated substrate,
wherein the dielectric layer of the flexible connector is formed such that the dielectric layer is non-planar with the die of the first integrated circuit (IC) package.

27. The method of claim 26, wherein the dielectric layer and the interconnect of the flexible connector are formed such that the dielectric layer and the interconnect contiguously extend into the first laminated substrate and the second laminated substrate.

28. The method of claim 26, wherein the dielectric layer is formed such that the dielectric layer extends into a substantial portion of the first laminated substrate.

29. The method of claim 26, wherein the first laminated substrate includes a core layer that is substantially co-planar with the die, and wherein the dielectric layer of the flexible connector extends into the first laminated substrate such that the dielectric layer is over the core layer, the core layer being separate from the flexible connector.

30. The method of claim 26, wherein the flexible connector comprises an adhesive layer, and wherein the flexible connector is an asymmetrical flexible connector comprising a number of dielectric layer that is different than a number of adhesive layer.

31. The method of claim 26, wherein the dielectric layer comprises a polyimide (PI) layer.

\* \* \* \* \*